(12) United States Patent
Seo et al.

(10) Patent No.: US 11,336,001 B2
(45) Date of Patent: May 17, 2022

(54) SUBSTRATE FOR PREVENTING DETERIORATION OF ANTENNA PERFORMANCE AND ELECTRONIC DEVICE COMPRISING SAME

(71) Applicant: Samsung Electronics Co., Ltd., Gyeonggi-do (KR)

(72) Inventors: Mincheol Seo, Gyeonggi-do (KR); Dongyeon Kim, Gyeonggi-do (KR); Hojung Nam, Gyeonggi-do (KR); Jeongwan Park, Gyeonggi-do (KR); Chankyu An, Gyeonggi-do (KR); Sungjun Lee, Gyeonggi-do (KR); Nakchung Choi, Gyeonggi-do (KR); Yoonjae Lee, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 16/964,680

(22) PCT Filed: Dec. 17, 2018

(86) PCT No.: PCT/KR2018/015993
§ 371 (c)(1),
(2) Date: Jul. 24, 2020

(87) PCT Pub. No.: WO2019/146909
PCT Pub. Date: Aug. 1, 2019

(65) Prior Publication Data
US 2020/0350669 A1 Nov. 5, 2020

(30) Foreign Application Priority Data

Jan. 26, 2018 (KR) .......................... 10-2018-0010065

(51) Int. Cl.
*H01Q 1/38* (2006.01)
*H01Q 1/00* (2006.01)
(Continued)

(52) U.S. Cl.
CPC ............... *H01Q 1/38* (2013.01); *H01Q 1/002* (2013.01); *H01Q 1/22* (2013.01); *H05K 1/111* (2013.01)

(58) Field of Classification Search
CPC ............ H01Q 1/38; H01Q 1/002; H01Q 1/22; H01Q 1/52; H01Q 1/48; H01Q 1/243;
(Continued)

(56) References Cited

U.S. PATENT DOCUMENTS

2012/0075002 A1* 3/2012 Uejima .................... H04B 1/48
327/365
2013/0314170 A1* 11/2013 Yamaguchi ............... H01P 1/10
333/101
(Continued)

FOREIGN PATENT DOCUMENTS

| JP | 2013-247438 A | 12/2013 |
| KR | 10-0702832 B1 | 4/2007 |
| KR | 10-2017-0018021 A | 2/2017 |

*Primary Examiner* — David E Lotter
(74) *Attorney, Agent, or Firm* — Cha & Reiter, LLC

(57) ABSTRACT

According to one embodiment of the disclosure, an electronic device comprises: a printed circuit board including a conductive pattern; and a tuner mounted on the conductive pattern and electrically connected to the conductive pattern, wherein the tuner comprises: a ground; a first conductive pad; a first switching element electrically connected between the ground and the first conductive pad; and a second conductive pad electrically disconnected with the ground, wherein the conductive pattern may comprise: a first electrical path in electrical contact with the first conductive pad; and a second electrical path in electrical contact with the
(Continued)

second conductive pad and electrically shorted to the first electrical path. Various other embodiments are possible.

14 Claims, 24 Drawing Sheets

(51) Int. Cl.
*H01Q 1/22* (2006.01)
*H05K 1/11* (2006.01)

(58) Field of Classification Search
CPC ............... H01Q 1/2208; H05K 1/111; H05K 2201/10098; H05K 1/0231; H05K 1/0233; H05K 1/025; Y02P 70/50; H04B 1/005; H04B 1/18; H04B 1/0458; H04M 1/02; H04M 1/0277
See application file for complete search history.

(56) References Cited

U.S. PATENT DOCUMENTS

| | | |
|---|---|---|
| 2014/0220911 A1 | 8/2014 | Bendixen et al. |
| 2016/0020815 A1* | 1/2016 | Lee .................... H03K 17/122 455/78 |
| 2017/0005047 A1 | 1/2017 | Kawasaki et al. |

\* cited by examiner

| Switch On-Resistance and Off-Capacitance | | |
|---|---|---|
| RON (SW1, SW2 & SW3) | 0.8 ~ 1.1 Ω | 100 MHz |
| COFF | 0.25 ~ 0.29 pF | SW2 & SW3 |
| | 0.45 ~ 0.65 pF | SW1 |

FIG.4B

SUBSTRATE FOR PREVENTING DETERIORATION OF ANTENNA PERFORMANCE AND ELECTRONIC DEVICE COMPRISING SAME

CROSS-REFERENCE TO RELATED APPLICATION(S)

This application is a National Phase Entry of PCT International Application No. PCT/KR2018/015993, which was filed on Dec. 17, 2018 and claims priority to Korean Patent Application No. 10-2018-0010065, which was filed on Jan. 26, 2018, the contents of which are incorporated herein by reference.

TECHNICAL FIELD

Various embodiments of the disclosure relate to a substrate for preventing deterioration of an antenna performance and an electronic device including the same.

BACKGROUND ART

In line with development of digital technologies, various types of electronic devices have been provided, such as smartphones, tablet personal computers (PCs), and personal digital assistants (PDAs). Electronic devices have also been developed such that users can wear the same, in order to improve portability and user accessibility. An electronic device may include an antenna for transmitting radio waves to a free space or receiving radio waves from the outside, and an element for adjusting the resonance frequency of the antenna (hereinafter, referred to as "frequency adjustment element"). The number of frequency adjustment elements mounted on each electronic device has tended to increase, because the frequency band to be secured by electronic devices are becoming wider and more diversified.

DISCLOSURE OF INVENTION

Technical Problem

The frequency adjustment element may have element characteristics that influence the antenna performance. For example, the frequency adjustment element may cause a resistance resulting from such element characteristics or a parasitic element such as a parasitic capacitance, and such a parasitic element may result in mismatching between the impedance of the antenna and the impedance of the transmission line, thereby degrading the antenna performance. The parasitic element of the frequency adjustment element may have a small value, but such a parasitic element may, in connection with communication in a high-frequency band, seriously degrade the antenna performance. It has been proposed to mount an additional element as a solution for removing the parasitic element of the frequency adjustment element, but this solution may require increased cost and space for mounting such an element.

Various embodiments of the disclosure may provide a substrate for preventing deterioration of the antenna performance without having to mount an additional element for reducing the parasitic element of the frequency adjustment element, which results from the element characteristics, on the substrate, and an electronic device including the same.

Solution to Problem

In accordance with an embodiment of the disclosure, an electronic device may include: a printed circuit board including a conductive pattern; and a tuner mounted on the conductive pattern and electrically connected to the conductive pattern. The tuner may include: a ground; a first conductive pad; a first switching element electrically connected between the ground and the first conductive pad; and a second conductive pad electrically separated from the ground. The conductive pattern may include: a first electrical path configured to electrically contact the first conductive pad; and a second electrical path configured to electrically contact the second conductive pad and electrically shorted to the first electrical path.

Advantageous Effects of Invention

According to various embodiments of the disclosure, when a substrate is fabricated, a conductive pattern on the substrate, on which a frequency adjustment element such as a switch module or a tuner is mounted, is formed in a structure for reducing the parasitic element of the frequency adjustment element, thereby making it possible to secure the antenna performance without adding an element (for example, lump component) for reducing the parasitic element.

BRIEF DESCRIPTION OF DRAWINGS

FIG. 4B is a table regarding a parasitic element of the frequency adjustment module in FIG. 4A.

BEST MODE FOR CARRYING OUT THE INVENTION

Figure 1:
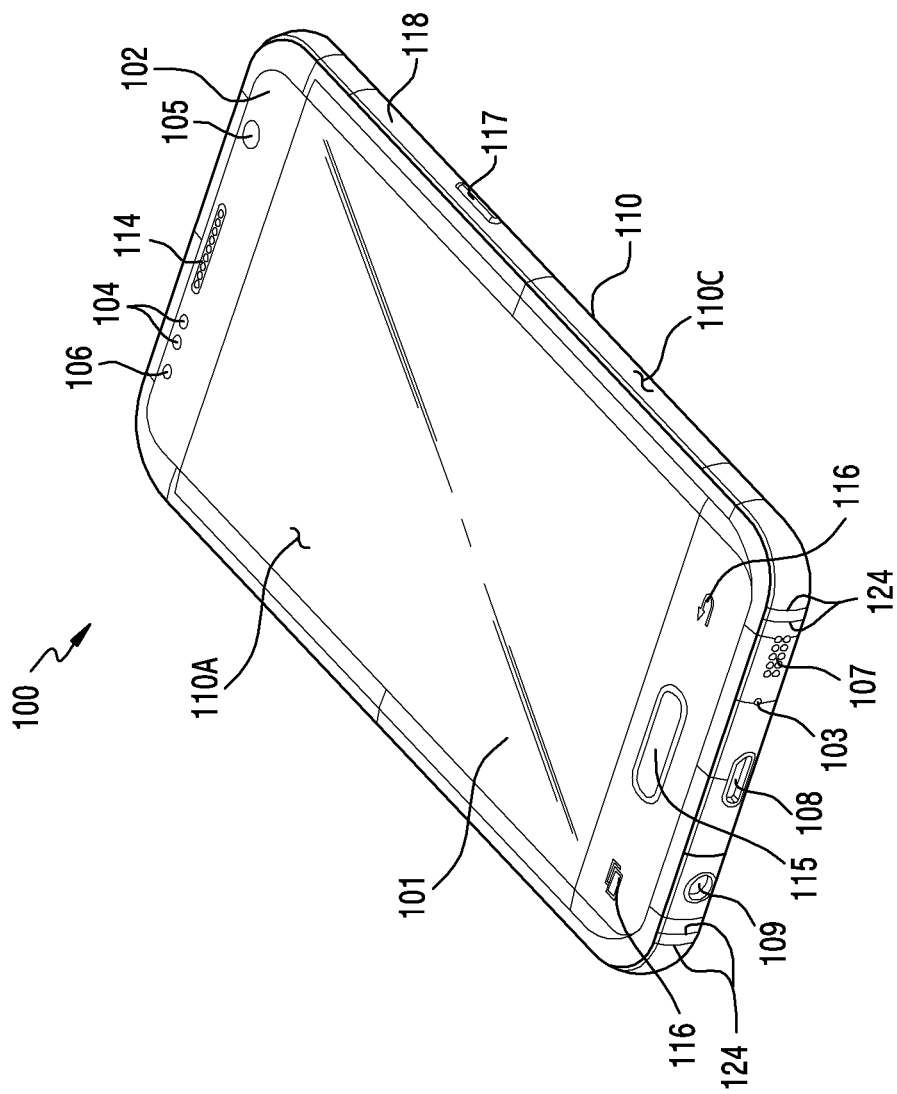
FIG. 1 is a front perspective view of an electronic device according to an embodiment.

Hereinafter, various embodiments of this document are described with reference to the accompanying drawings. It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

Figure 2:
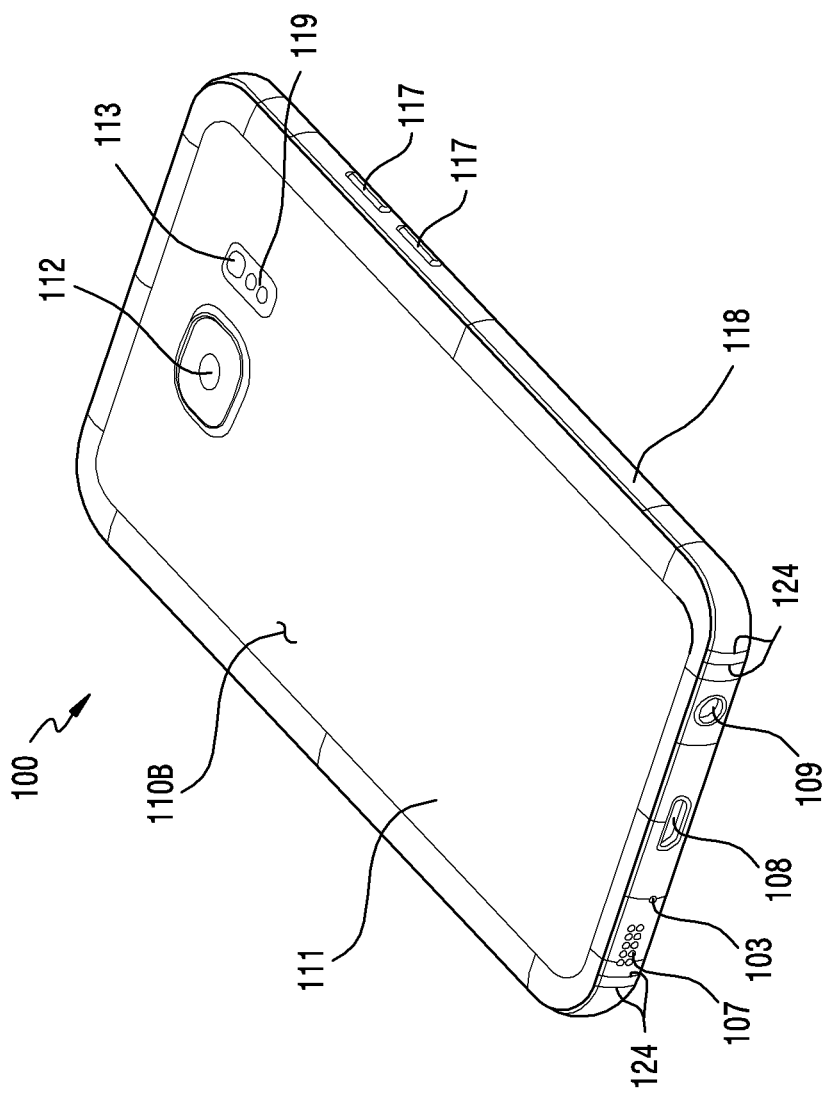
FIG. 2 is a rear perspective view of the electronic device in FIG. 1.
Figure 3:
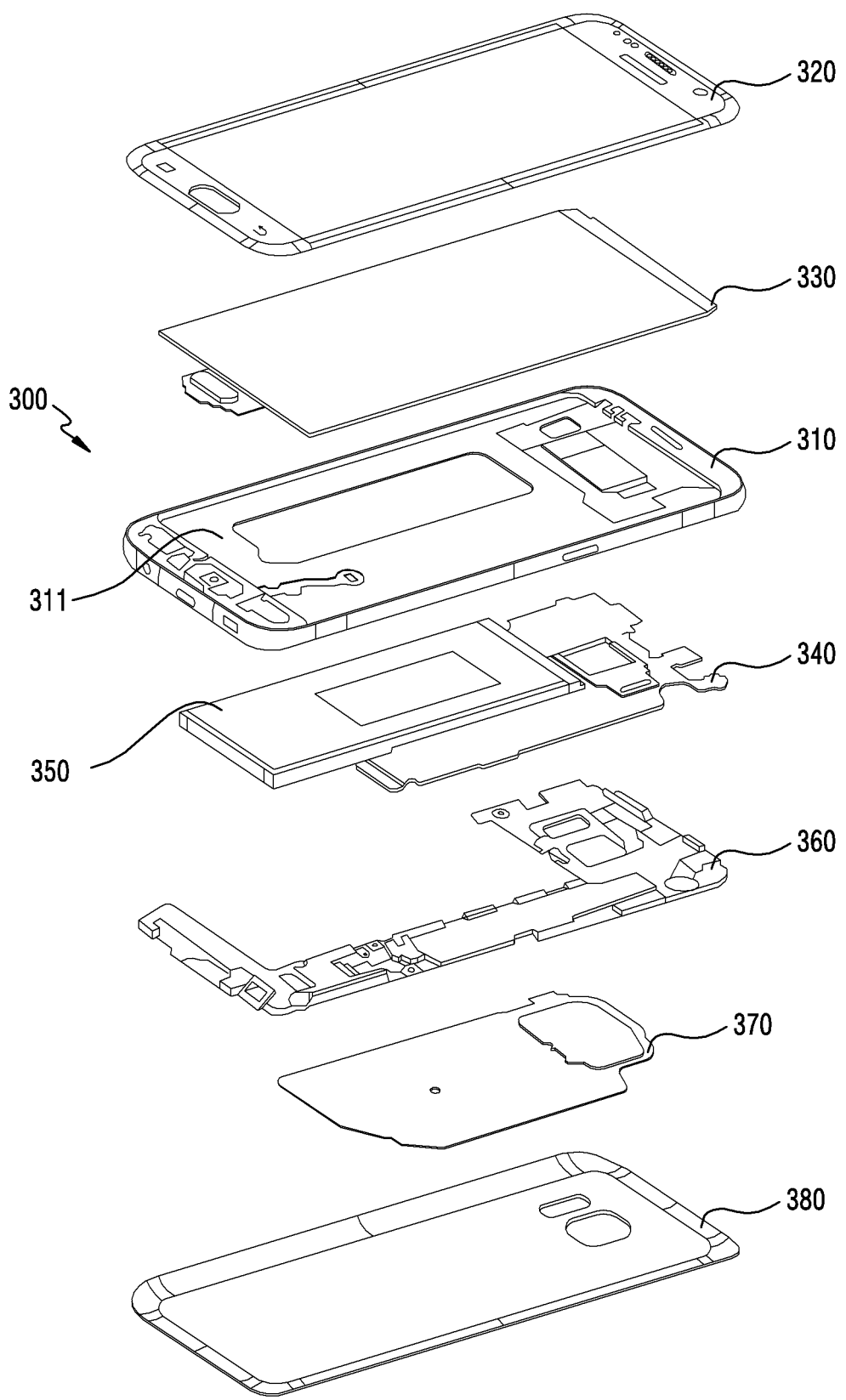
FIG. 3 is an exploded perspective view of the electronic device in FIG. 1.

FIG. 1 is a front perspective view of an electronic device according to an embodiment. FIG. 2 is a rear perspective view of the electronic device in FIG. 1. FIG. 3 is an exploded perspective view of the electronic device in FIG. 1.

Referring to FIG. 1 and FIG. 2, the electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may refer to a structure forming at least some of the first surface 110A, the second surface 110B, and the side surface 110C in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 which is substantially opaque. The rear plate 111 may be made of, for example, coated or colored glass, ceramic, a polymer, a metal (for example, aluminum, stainless steel (STS), or magnesium), or a combination of at least two of the above materials. The side surface 110C may be formed by a side bezel structure (or "side member") 118, which is coupled to the front plate 102 and the rear plate 111, and which includes a metal and/or a polymer. In some embodiments, the rear plate 111 and the side bezel structure 118 may be formed integrally, and may include the same material (for example, metal material such as aluminum).

According to an embodiment, the electronic device 100 may include at least one of a display 101, audio modules 103, 107, and 114, sensor modules 104 and 119, camera modules 105, 112, and 113, key input devices 115, 116, and 117, an indicator 106, or connector holes 108 and 109. In some embodiments, at least one of the components of the electronic device 100 (for example, key input devices 115, 116, and 117 or indicator 106) may be omitted, or the same may further include another component.

The display 101 may be exposed through a corresponding part of the front plate 102, for example. The display 101 may be coupled to a touch sensing circuit, a pressure sensor capable of measuring the intensity (pressure) of a touch, and/or a digitizer configured to detect a magnetic field-type stylus pen, or may be disposed adjacent thereto.

The audio modules 103, 107, and 114 may include a microphone hole 103 and speaker holes 107 and 114. The microphone hole 103 may have a microphone disposed therein so as to acquire a sound from the outside, and, in some embodiments, multiple microphones may be disposed such that the direction of a sound can be sensed. The speaker holes 107 and 114 may include an outer speaker hole 107 and a telephone speech receiver hole 114. In some embodiments, the speaker holes 107 and 114 and the microphone hole 103 may be implemented as a single hole, or a speaker may be included without the speaker holes 107 and 114 (for example, piezoelectric speaker).

The sensor modules 104 and 119 may produce an electric signal or a data value corresponding to the operating state inside the electronic device 100, or the environment state outside the same. The sensor modules 104 and 119 may include, for example, a first sensor module 104 (for example, proximity sensor) disposed on the first surface 110A of the housing 110 and/or a second sensor module (not illustrated) (for example, fingerprint sensor), and/or a third sensor module 119 (for example, HRM sensor) disposed on the second surface 110B of the housing 110. The fingerprint sensor may be disposed not only on the first surface 110A (for example, home key button 115) of the housing 110, but also on the second surface 110B thereof. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 disposed on the first surface 110A of the electronic device 100, a second camera device 112 disposed on the second surface 110B thereof, and/or a flash 113. The camera modules 105 and 112 may include one lens or multiple lenses, an image sensor, and/or an image signal processor. The flash 113 may include, for example, a light-emitting diode or a xenon lamp. In some embodiments, two or more lenses (wide-angle and telephoto lenses) and image sensors may be disposed on a surface of the electronic device 100.

The key input devices 115, 116, and 117 may include a home key button 115 disposed on the first surface 110A of the housing 110, a touch pad 116 disposed near the home key button 115, and/or a side key button 117 disposed on the side surface 110C of the housing 110. In another embodiment, the electronic device 100 may not include some or all of the above-mentioned key input devices 115, 116, and 117, and the key input devices 115, 116, and 117 not included may be implemented on the display 101 in a different type, such as soft keys (or software keys).

The indicator 106 may be disposed on the first surface 110A of the housing 110, for example. The indicator 106 may provide state information of the electronic device 100 in an optical type, for example, and may include an LED.

The connector holes 108 and 109 may include a first connector hole 108 capable of containing a connector (for example, USB connector) for transmitting/receiving power and/or data with an external electronic device and/or a second connector hole 109 (for example, earphone jack) 109 capable of containing a connector for transmitting/receiving an audio signal with the external electronic device.

Referring to FIG. 3, the electronic device 300 (for example, electronic device 100 in FIG. 1 or FIG. 2) may include a side bezel structure (or side member) 310, a first support member 311 (for example, bracket), a front plate 320, a display 330, a printed circuit board 340, a battery 350, a second support member 360 (for example, rear case), an antenna 370, and a rear plate 380. In some embodiments, at least one of the components of the electronic device 300 (for example, first support member 311 or second support member 360) may be omitted, or the same may further include another component. At least one of the components of the electronic device 300 may be identical or similar to at least one of the components of the electronic device 100 in FIG. 1 or FIG. 2, and repeated descriptions thereof will be omitted herein.

The first support member 311 may be disposed inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and may be disposed between the front plate 320 and the first support member 311. The printed circuit board 340 may be coupled to the other surface of the first support member 311, and may be disposed between the first support member 311 and the rear plate 380.

The battery 350 is a device for supplying power to at least one component of the electronic device 300, and may include, for example, a primary battery that is not rechargeable, a secondary battery that is rechargeable, or a fuel cell. At least a part of the battery 350 may be disposed on substantially the same plane with the printed circuit board 340, for example. The battery 350 may be integrally disposed inside the electronic device 300, or may be disposed such that the same can be attached to/detached from the electronic device 300.

The second support member 360 may be coupled to the first support member 311 and may be disposed between the printed circuit board 340 and the rear plate 380. The second support member 360 may be coupled to the first support member 311 by using bolt fastening, for example, together with the printed circuit board 340, and may play the role of covering and protecting the printed circuit board 340.

The antenna 370 may be disposed between the rear plate 380 and the battery 350. The antenna 370 may include, for example, a near-field communication (NFC) antenna, a wireless charging antenna, and/or a magnetic secure transmission (MST) antenna. The antenna 370 may conduct short-range communication with an external device, for example, or wirelessly transmit/receive power necessary for charting. In another embodiment, an antenna structure may be formed by the side bezel structure 310 and/or a part of the first support member 311 or a combination thereof.

The printed circuit board 340 may have a processor, a memory, and/or an interface mounted thereon. The processor may include, for example, at least one of a central processing device, an application processor, a graphic processing device, an image signal processor, a sensor hub processor, or a communication processor. The memory may include, for example, a volatile memory or a nonvolatile memory. The interface may include, for example, a high-definition multimedia interface (HDMI), a universal serial bus (USB) interface, an SD card interface, and/or an audio interface. The interface may connect, for example, the electronic device 300 and an external electronic device electrically or physically, and may include a USB connector, an SD card/MMC connector, or an audio connector.

According to an embodiment, the printed circuit board 340 may have a frequency adjustment module (or frequency adjustment element) mounted thereon so as to adjust the resonance frequency of the antenna. The frequency adjustment module may be provided in a chip type and multiple terminals of the chip may be coupled to the printed circuit board 340 by using a surface mounting technology (SMT). The printed circuit board 340 may have an area having a conductive pattern related to the frequency adjustment module (hereinafter, referred to as "first area"). The conductive pattern of the first area may include conductive lands coupled to multiple conductive pads (or terminals) of the frequency adjustment module by soldering, and electrical paths (for example, conductive paths or conductive lines) connected to the conductive lands. The electrical paths of the first area may be electrically connected to a wireless communication module (or communication circuit) disposed in a different position from the first area, an antenna module, a ground, or the like. The wireless communication module may acquire a signal from the processor and transmit the acquired signal to an external electronic device through the antenna. The wireless communication module may receive a signal sent by the external electronic device through the antenna and provide the received signal to the processor. The antenna module may include at least one antenna for transmitting a signal to the outside or receiving a signal from the outside. The antenna module may include the antenna 370 disposed between the rear plate 380 and the battery, or may be designed as a microstrip mounted on the printed circuit board 340. The wireless communication module may transmit a signal to the external electronic device through an antenna appropriate for the communication scheme or receive a signal from the external electronic device through the same. According to an embodiment, the frequency adjustment module may move the resonance frequency of the antenna to a designated frequency under the control of the wireless communication module or the processor, in order to support the corresponding communication, or move the resonance frequency of the antenna by a designated amount.

According to some embodiments, the antenna module may include at least one wireless charging antenna for transmitting power to the outside or receiving power from the outside. In this case, the electronic device 300 may include a wireless charging module, and the wireless charging module may wirelessly transmit power to an external electronic device through the wireless charging antenna or wirelessly receiver power from the external electronic device through the same. The wireless charging module may support various wireless charging schemes, including a magnetic resonance scheme or a magnetic induction scheme, for example. At least one wireless charging antenna may be provided separately from the antennas for the wireless communication module. According to some embodiments, the wireless charging module may be designed to utilize at least a part of a radiator of the antenna for the wireless communication module. According to various embodiments, the electrical paths disposed in the first area of the printed circuit board 340 may be electrically connected to a wireless charging module or wireless charging antennas disposed in a different position from the first area. For example, the frequency adjustment module may move the resonance frequency of the antenna to a designated frequency under the control of the wireless charging module or the processor, in order to support wireless charging according to the magnetic resonance scheme, or move the resonance frequency of the antenna by a designated amount.

The antenna may be defined as a converter that transfers an electromagnetic wave from a transmission line to a free space or from the free space to the transmission line, and may be designed to transmit or receive electromagnetic wave energy with a direction and a polarization appropriate for the purpose. The reflection characteristics and impedance of the antenna are related to the antenna performance, and may vary depending on the shape, size, and material of the antenna. The radiation characteristics of the antenna may include an antenna radiation pattern (or antenna pattern), which is a directivity function indicating the relative distribution of power radiated by the antenna, and the state of polarization of radio waves radiated by the antenna (or antenna polarization). The antenna impedance may be related to transfer of power from a transmitter to the antenna or transfer of power from the antenna to a receiver. In order to minimize reflection at the part of connection between the transmission line and the antenna, the impedance of the antenna is designed to match with the impedance of the transmission line, and this may enable maximum power transfer (or minimized power loss) through the antenna or efficient signal transfer. Such impedance matching may guide an efficient signal flow at a specific frequency.

Figure 4A:
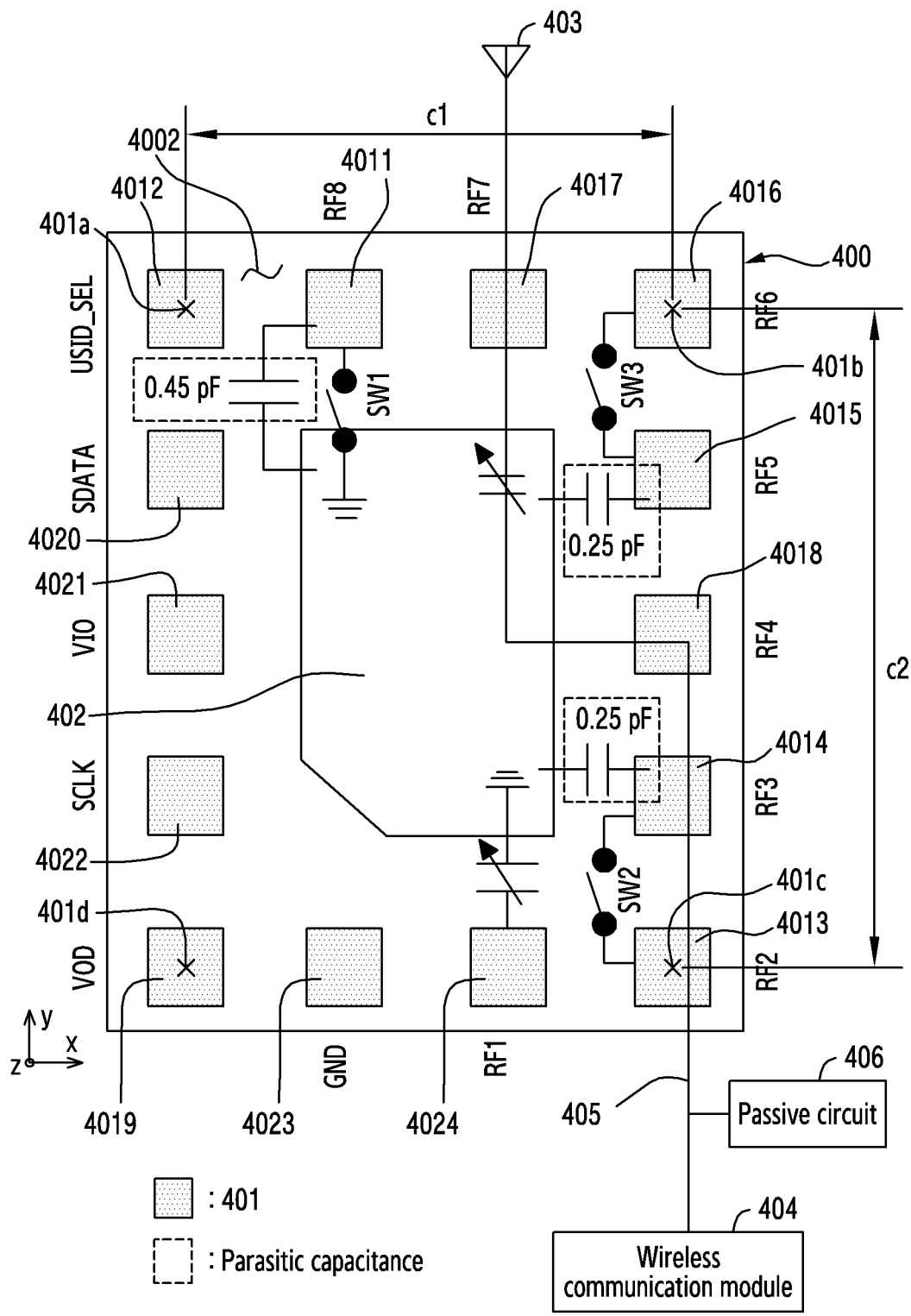
FIG. 4A schematically illustrates a frequency adjustment module according to an embodiment, and a transmission line utilizing the frequency adjustment module.
Figure 4C:
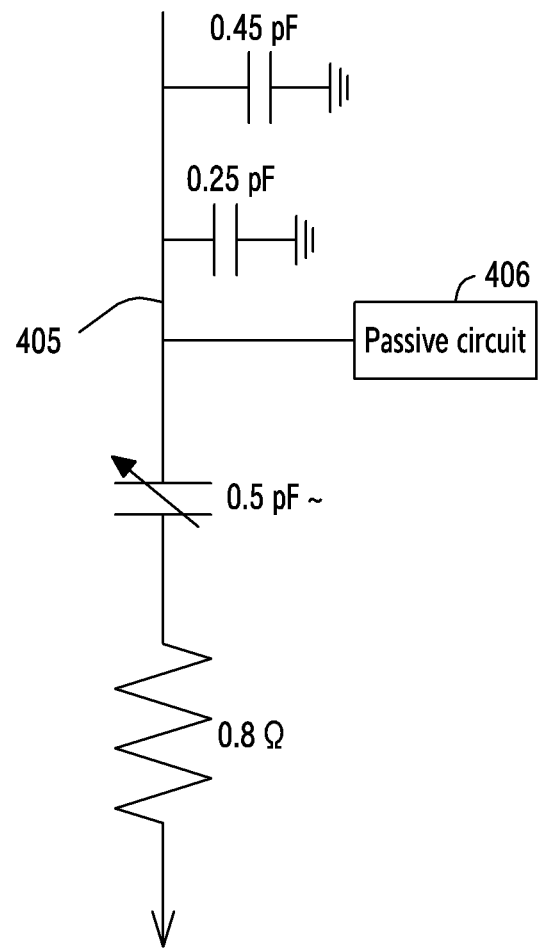
FIG. 4C is an equivalent circuit regarding a transmission line utilizing the frequency adjustment module in FIG. 4A.

FIG. 4A schematically illustrates a frequency adjustment module according to an embodiment, and a transmission line utilizing the frequency adjustment module. FIG. 4B is a table regarding a parasitic element of the frequency adjustment module in FIG. 4A. FIG. 4C is an equivalent circuit regarding a transmission line utilizing the frequency adjustment module in FIG. 4A.

Referring to FIG. 4A, the frequency adjustment module 400 may have multiple functionally distinguished conductive pads 401 disposed on the back surface 4002 thereof. According to some embodiments, the frequency adjustment module 400 may be configured in such a type that the same includes leads replacing replaces various conductive pads 401, or in various other types. The multiple conductive pads 401 may be disposed approximately in rectangular ring types, and may be coupled to a conductive pattern of a printed circuit board (for example, 340 in FIG. 3) by using soldering. The frequency adjustment module 400 may include a ground 402 disposed on the back surface 4002 thereof between the multiple conductive pads 401, and the ground 402 may be coupled to a ground pad of the printed circuit board 340 by using soldering. The frequency adjustment module 400 is an element including one or more switching elements (or simply switches) SW1, SW2, and SW3 and serial and/or parallel tunable capacitors implementing various capacitances, and may be a switch module or a tuner, for example.

According to an embodiment, the frequency adjustment module 400 may include a first conductive pad 4011 and a first switching element SW1 electrically connected between the first conducive pad 4011 and the ground 402. The frequency adjustment module 400 may include a third conductive pad 4013, a fourth conducive pad 4014, and a second witching element SW2 electrically connected between the third conductive pad 4013 and the fourth conductive pad 4014. The frequency adjustment module 400 may include a fifth conducive pad 4015, a sixth conductive pad 4016, and a third switching element SW3 electrically connected between the fifth conductive pad 4015 and the sixth conductive pad 4016.

According to an embodiment, the frequency adjustment module 400 may include a second conductive pad 4012 electrically separated from the ground 402. The second conductive pad 4012 may be disposed in a first position 401*a* on the back surface 4002, and the sixth conductive pad 4016 may be disposed in a second position 401*b* spaced apart from the first position 401*a* in the x-axis direction by a first distance c1. One or more conductive pads (for example, first conductive pad 4011 and seventh conductive pad 4017) may be disposed between the second conductive pad 4012 and the sixth conductive pad 4016, and the first conductive pad 4011 may be disposed immediately adjacent to the second conductive pad 4012.

According to an embodiment, the third conductive pad 4013 may be disposed in a third position 401*c* spaced apart from the second position 401*b* in the y-axis direction by a second distance c2. One or more conductive pads (for example, fifth conductive pad 4015, eight conductive pad 4018, and 14$^{th}$ conductive pad 4014) may be disposed between the sixth conductive pad 4016 and the third conductive pad 4013, and the fourth conductive pad 4014 may be disposed immediately adjacent to the third conductive pad 4013. The fifth conductive pad 4015 may be disposed immediately adjacent to the sixth conductive pad 4016.

According to an embodiment, the multiple conductive pads 401 may include a 19$^{th}$ conductive pad 4019 disposed in a fourth position 401*d* spaced apart from the first position 401*a* in the y-axis direction by the second distance c2 and spaced apart from the third position 401*c* in the x-axis direction by the first distance c1, one or more conductive pads (for example, second conductive pad 4020, 21$^{st}$ conductive pad 4021, and 22$^{nd}$ conductive pad 4022) disposed between the first position 401*a* and the fourth position 401*d*, and one or more conductive pads (for example, 23$^{rd}$ conductive pad 4023 and 24$^{th}$ conductive pad 4024) disposed between the third position 401c and the fourth position 401d.

The frequency adjustment module 400 may be connected to the transmission line 405 between the antenna 403 and the wireless communication module 404, and may move the resonance frequency of the antenna to a designated frequency under the control of the wireless communication module 404 or the processor (not illustrated), in order to support the corresponding communication, or move the resonance frequency of the antenna by a designated amount. The transmission line 405 is a structure for transferring a radio-frequency (RF) signal (voltage or current), and may be defined as a conductor system using a wave transfer action by means of an electrical parameter (resistance per unit length, inductance, conductance, or capacitance).

In an embodiment, the frequency band may be defined as a low band (LB) (about 600-1 GHz), a middle band (MB) (about 1-2.2 GHz), a high band (HB) (about 2.2-2.7 GHz), an ultrahigh band (UHB) (about 2.7-3.6 GHz), or the like. The transmission line may be designed to support various communication services of a global system for mobile communication (GSM), long term evolution (LTE), or 5$^{th}$ generation (5G) network, for example, utilizing such a frequency band. According to an embodiment, the transmission line 405 illustrated in FIG. 4A may correspond to a transmission line supporting a communication mode using the HB or UHB. Without being limited thereto, various other transmission lines utilizing the frequency adjustment module 400 according to the communication mode may be formed.

The frequency adjustment module 400 may have element characteristics that influence the antenna performance. For example, referring to FIG. 4A and FIG. 4B, when the switches elements SW1, SW2, and SW3 included in the frequency adjustment module 400 are turned on, a resistance (switch on-resistance (RON) of about 0.8-1.1Ω may be produced. In addition, while the second and third switching elements SW2 and SW3 are turned off, a parasitic capacitance (off-capacitance (COFF)) of about 0.25-0.29 pF may be produced, and while the first switching element SW1 is turned off, a COFF of about 0.45-0.65 pF may be produced. Such a RON or COFF resulting from the element characteristics is a parasitic element that causes impedance mismatching of the transmission line, and may degrade the antenna performance. Since the frequency adjustment module 400 is adjusted to support the transmission line in the corresponding communication mode, the frequency adjustment module 400 may have various parasitic elements, depending on the communication mode. In an embodiment, referring to FIG. 4A, FIG. 4B, and FIG. 4C, the parasitic element (for example, parasitic capacitance) of the frequency adjustment module 400 on the transmission line may be about 0.25 pF produced while the second switching element SW2 and the third switching element SW3 are turned off, and about 0.45 pF produced while the first switching element SW1 is turned off.

In an embodiment, referring to FIG. 4A and FIG. 4C, the transmission line 405 may include at least one passive circuit 406 electrically connected to the transmission line 405. The at least one passive circuit 406 may reduce the parasitic element of the frequency adjustment module 400 resulting from the element characteristics. In an embodiment, referring to FIG. 3 and FIG. 4A, the at least one passive circuit 406 may be formed by at least some of the conductive patterns disposed in the first area of the printed circuit board 340. The conductive patterns disposed in the first area may include a part for providing the transmission line 405 with an electrical parameter, such as inductance or capacitance, capable of reducing the parasitic element of the frequency adjustment module 400 resulting from the element characteristics. If the parasitic element of the frequency adjustment module 400 is removed by at least some of the conductive patterns disposed in the first area, the impedance of the transmission line 405 may match with the impedance of the antenna 403, and this may enable efficient signal transfer while minimizing power loss at a specific frequency.

According to various embodiments, the electronic device 300 may further include various elements (or modules) according to the type in which the same is provided. Such components are modified substantially variously according to the trend of convergence of digital devices, and thus cannot be enumerated entirely, but the electronic device 300 may further include a component at an equivalent level to the above-mentioned components. It is obvious that specific components among the components of the electronic device 300 may be excluded or replaced with another component, according to the type in which the same is provided.

Figure 5A:
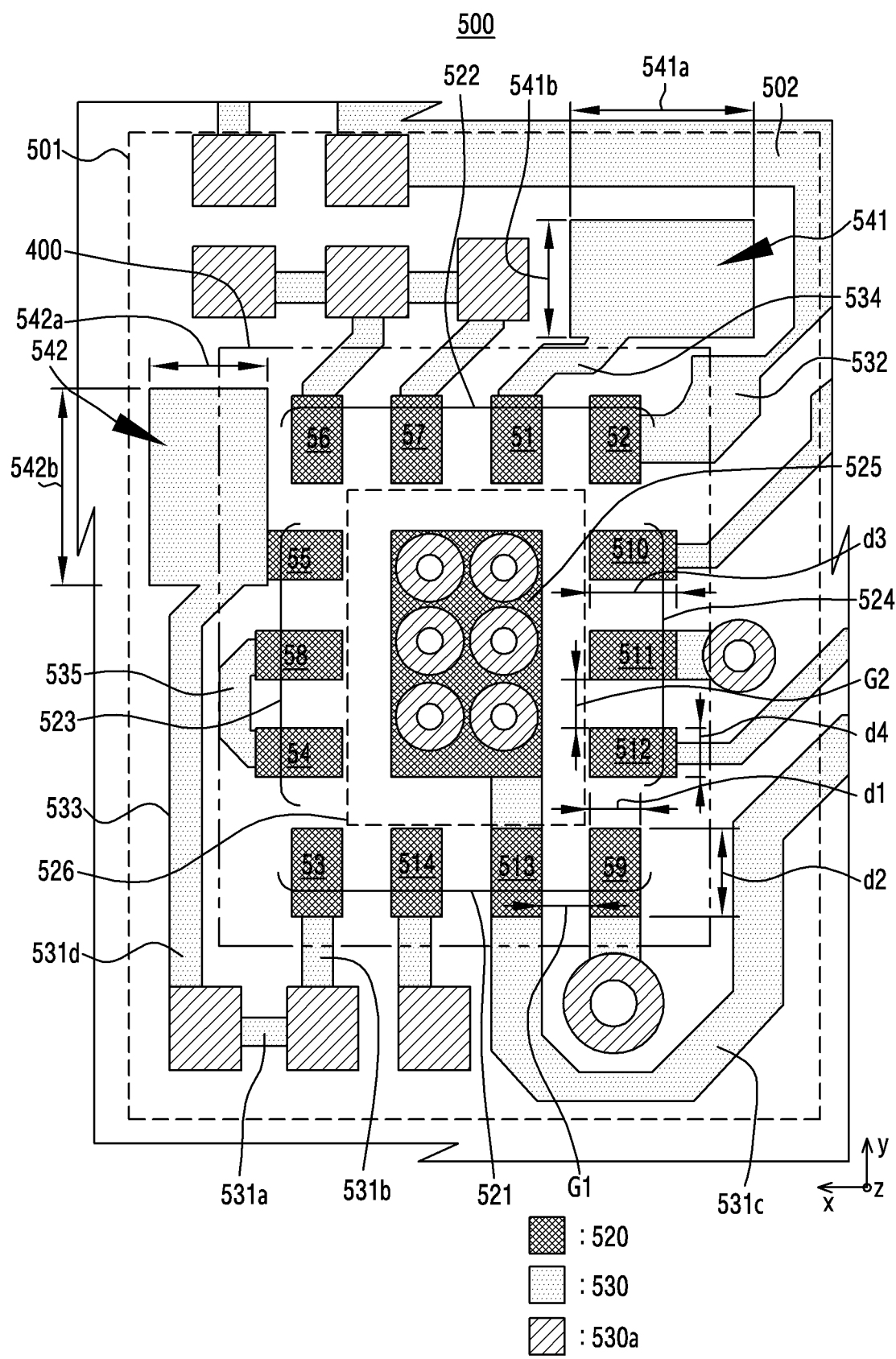
FIG. 5A illustrates a printed circuit board for removing a parasitic element of a frequency adjustment module according to an embodiment.
Figure 5B:
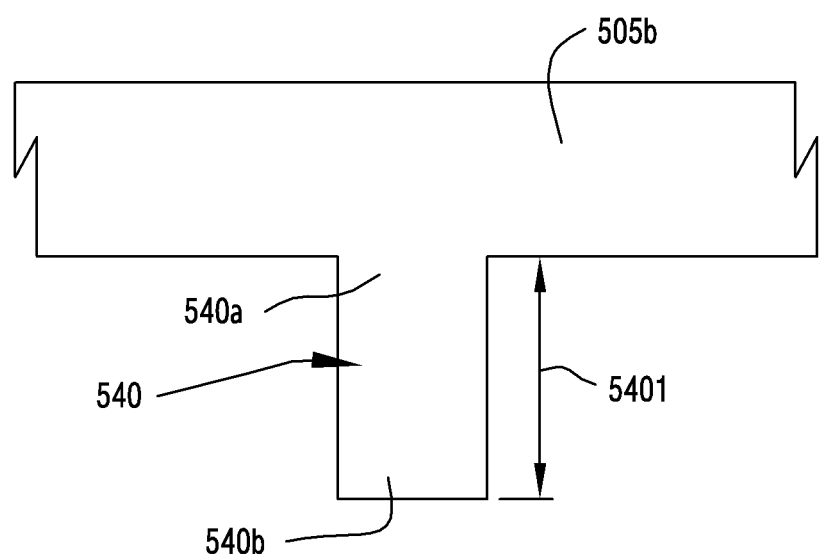
FIG. 5B schematically illustrates the structure of an open stub according to an embodiment.
Figure 5C:
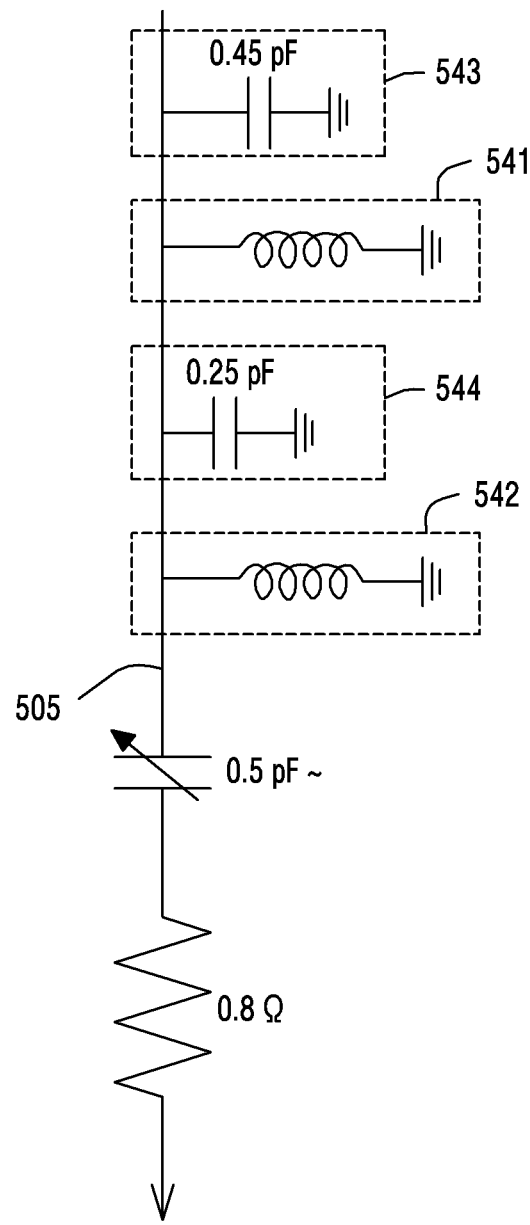
FIG. 5C and FIG. 5D illustrate equivalent circuits when open stubs are applied to a transmission line utilizing a frequency adjustment module.
Figure 5D:
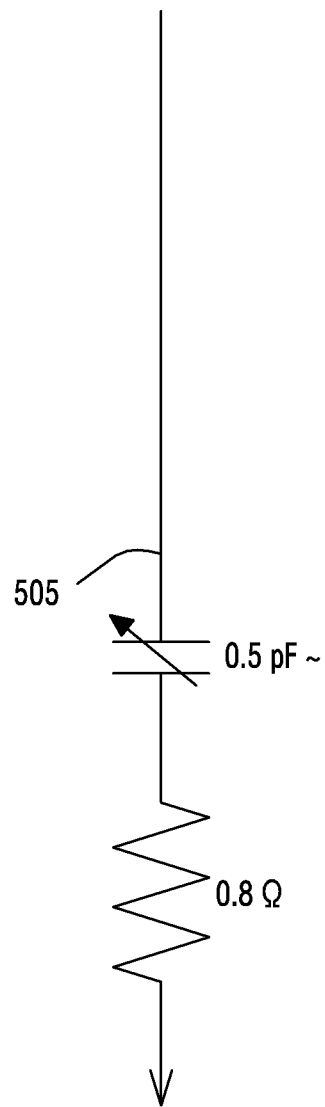
Figure 5E:
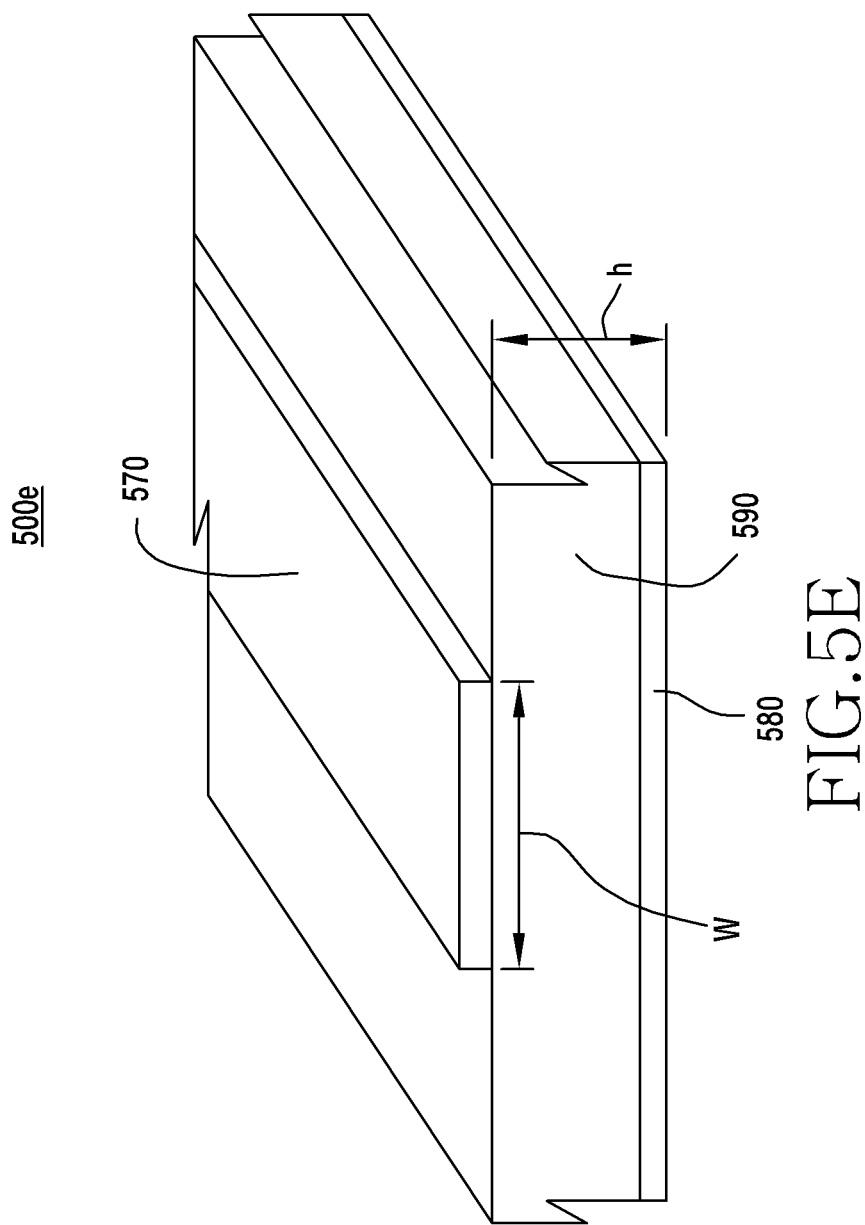
FIG. 5E is a diagram for describing parameters regarding a stub according to an embodiment.

FIG. 5A illustrates a printed circuit board for removing a parasitic element of a frequency adjustment module according to an embodiment. FIG. 5B schematically illustrates the structure of an open stub according to an embodiment. FIG. 5C and FIG. 5D illustrate equivalent circuits when open stubs are applied to a transmission line utilizing a frequency adjustment module. FIG. 5E is a diagram for describing parameters regarding a stub according to an embodiment.

Referring to FIG. 4A and FIG. 5A, the printed circuit board 500 may include a first area 501 regarding the frequency adjustment module 400 (for example, area at least partially covered by the frequency adjustment module 400) (in FIG. 5A, the frequency adjustment module installed on the printed circuit board 500 is indicated by a virtual line (line made of alternate long and two short dashes)). The first area 501 may include conductive lands 520 to which multiple conductive pads 401 of the frequency adjustment module 400 are coupled, and electrical paths 530 extending from the conductive lands 520. According to an embodiment, the conductive lands 520 may include a first group 521 including a third land 53, a 14$^{th}$ land 514, a 13$^{th}$ land 513, and a 9$^{th}$ land 59 disposed in the x-axis direction. The lands 53, 514, 513, and 59 of the first group 521 may be rectangles having substantially the same size, which have a width d1 in the x-axis direction and a width d2 in the y-axis direction, and may be disposed at a predetermined gap G1. The conductive lands 520 may include a second group 522 including a sixth land 56 disposed at a distance from the third land 53 in the y-axis direction, and a seventh land 57, a first land 51, and a second land 52 disposed in a similar manner. The lands 56, 57, 51, and 52 of the second group 522 may be rectangles having substantially the same size, which have a width d1 in the x-axis direction and a width d2 in the y-axis direction, and may be disposed at a predetermined gap G1, as in the case of the pads of the first group 521.

The conductive lands 520 may include a fourth group 524 including a 12$^{th}$ land 512, an 11$^{th}$ land 511, and a 10$^{th}$ land 510 disposed in the y-axis direction. The lands 512, 511, and 510 of the fourth group 524 may be rectangles having substantially the same size, which have a width d3 in the x-axis direction and a width d4 in the y-axis direction, and may be disposed at a predetermined gap G2. The conductive pads 520 may include a third group 523 including a fourth land 54 disposed at a distance from the 12$^{th}$ land 512 in the x-axis direction, and an eighth land 58 and a fifth land 55 disposed in a similar manner. The lands 54, 58, and 55 of the third group 523 may be rectangles having substantially the same size, which have a width d3 in the x-axis direction and a width d4 in the y-axis direction, and may be disposed at a predetermined gap G2, as in the case of the pads of the fourth group 524. According to an embodiment, the first group 521, the second group 522, the third group 523, and the fourth group 524 may be disposed so as to surround a rectangular area 526. According to an embodiment, the conductive lands 520 may include a ground 525 disposed in the area 526, and the ground 525 may be coupled to the ground 402 of the frequency adjustment module 400 by using soldering.

The electrical paths 530 may be patterned in various types including a part extending in the x-axis direction (for example, 531a), a part extending in the y-axis direction (for example, 531b), a part extending at an acute angle (for example, 531c), a part extending in a curved shape, (not illustrated), or a combination of these parts. The printed circuit board 500 may include a layer made of an insulative material covering the electrical paths 530, and if the insulative material is transparent, the electrical paths 530 may be visible from the outside as in FIG. 5A. According to some embodiments, the electrical paths 530 may include parts 530a disposed on an end of an electrical path or disposed between electrical paths, and these parts 530a may be designed in various types, such as rectangles, to as to provide electrical parameters for reducing the impedance mismatching between the frequency adjustment module 400 and the transmission line. According to some embodiments, these parts 530a may be used as a pad for coupling another element through soldering.

The electrical paths 530 may be patterned to reflect a transmission line for supporting a flow of various interactions with the frequency adjustment module 400 and various elements related thereto (for example, wireless communication module 404, antenna 403, processor, and the like). According to some embodiments, the conductive patterns in the first area 501 may be variously designed according to the type in which the frequency adjustment module 400 is provided. Such modifications are very diversified, and thus cannot be enumerated entirely, but the type, size, gap, and the like of the conductive pads 520 and the electrical paths 530 may be designed to be at least partially different from the structure illustrated in FIG. 5A.

According to an embodiment, the first area 501 may include a fourth electrical path 534 connected to the first land 51. If the frequency adjustment module 400 is mounted on the printed circuit board 500, the first conductive pad 4011 of the frequency adjustment module 400 may be electrically connected to the first land 51 of the first area 501. According to an embodiment, the fourth electrical path 534 may include an open stub 541 formed on an end thereof (hereinafter, referred to as first open stub). The first open stub 541 may be a part of the fourth electrical path 534, which has a relatively large width 541a or 541b.

According to an embodiment, the first area 501 may include a second electrical path 532 connected to the second land 52. If the frequency adjustment module 400 is mounted on the printed circuit board 500, the second conductive pad 4012 of the frequency adjustment module 400 may be electrically connected to the second land 52 of the first area 501. According to an embodiment, the second electrical path 532 may be physically separated from the fourth electrical path 534.

According to an embodiment, the second electrical path 532 may be connected to a ground plane 502 of the printed circuit board 500, and the ground plane 502 may be defined as a part of the second electrical path 532.

According to an embodiment, the first area 501 may include a third electrical path 533 electrically connecting between the third land 53 and the fifth land 55. If the frequency adjustment module 400 is mounted on the printed circuit board 500, the third conductive pad 4013 of the frequency adjustment module 400 may be electrically connected to the third land 53 of the first area 501, and the fifth conductive pad 4015 of the frequency adjustment module 400 may be electrically connected to the fifth land 55 of the first area 501. The third electrical path 533 may include a path 531b which is connected to the third land 53, and which extends in the y-axis direction, a path 531a extending in the x-axis direction, and a path 531d which is connected to the fifth land 55, and which extends in the y-axis direction. According to an embodiment, the third electrical path 533 may include an open stub 542 which is close to the fifth land 55, or which is coupled thereto (hereinafter, referred to as second open stub). The second open stub 542 may be a part of the third electrical path 433, which has a relatively large width 542a or 542b.

According to an embodiment, the first area 501 may include a fifth electrical path 535 electrically connecting between the fourth land 54 and the eight land 58, and may be physically separated from the third electrical path 533. If the frequency adjustment module 400 is mounted on the printed circuit board 500, the fourth conductive pad 4014 of the frequency adjustment module 400 may be electrically connected to the fourth land 54 of the first area 501, and the eighth conductive pad 4018 of the frequency adjustment module 400 may be electrically connected to the eighth land 58 of the first area 501.

Referring to FIG. 5B, the open stub 540 (for example, first open stub 541 or second open stub 542) may be defined so as to include an end portion 540a connected to a transmission line 505b (for example, 405 in FIG. 4A), and another end 540b which extends from the end portion 540a, and which is in an open state. Input impedance, which is an electrical parameter of the open stub 540 with regard to the transmission line 505b, may be varied depending on the length 5401 of the open stub 540. Equation 1 and Equation 2 are related to the input impedance of the open stub 540.

$$Z_{in} = -jZ_0 \cot \beta l \quad \text{[Equation 1]}$$

($Z_{in}$: input impedance, l: length, $\beta$: phase constant [rad/m])

$$\beta = 2\pi/\lambda_g \quad \text{[Equation 2]}$$

($\lambda_g$: wavelength on transmission line)

Referring to Equation 1 and Equation 2, if the length 5401 of the open stub 540 (for example, the x-axis direction widths 541a and 542a of the first and second open stubs 541 and 542 or the y-axis direction widths 541b and 542b thereof) is smaller than $\lambda/4$, the open stub 540 may operate as a capacitor, and if the length 5401 of the open stub 540 is larger than $\lambda/4$ and smaller than $\lambda/2$, the open stub 540 may operate as an inductor. If the length 5401 of the open stub 540 is $\lambda/4$, $3\lambda/4$, $5\lambda/4$, or the like, the open stub 540 may operate as a band elimination filter (BEF). The first and second open stubs 541 and 542 may take a conceptual structure like the open stub 540 defined with reference to FIG. 5B, and the first and second open stubs 541 and 542 may provide the transmission line with electrical parameters such as resistance, inductance, capacitance, and the like. This enables the first and second open stubs 541 and 542 to reduce parasitic capacitances of the frequency adjustment module (for example, 400 in FIG. 4A). In an embodiment, referring to FIG. 4A and FIG. 5, the parasitic capacitance (for example, about 0.25 pF) that the frequency adjustment module 400 has when the third switching element SW3 is turned off may be removed by the first open stub 541 operating as an inductor. The parasitic capacitance (for example, about 0.45 pF) that the frequency adjustment module 400 has when the first switching element SW1 is turned off may be removed by the second open stub 542 operating as an inductor. Referring to FIG. 5C and FIG. 5D, since the parasitic capacitances 543 and 544 of the frequency adjustment module 400 are removed by the first and second open stubs 541 and 542, the impedance of the transmission line 505 matches with the impedance of the antenna, and this may prevent antenna performance deterioration.

According to various embodiments, the first open stub 541 or the second open stub 542 may be disposed in various different positions of conductive patterns of the first area 501 with regard to the transmission line 405, thereby removing the parasitic capacitance of the frequency adjustment module 400. According to an embodiment, an impedance corresponding to a designated frequency (for example, frequency designated in the corresponding communication mode) between the frequency adjustment module 400 and the first and second open stubs 541 and 542 may be formed. The impedance corresponding to the designated frequency may have substantially the same magnitude as that of the impedance of the antenna.

Referring back to FIG. 5A, in an embodiment, the first and second open stubs 541 and 542 may be rectangular thin plates having widths 541a and 542a in the x-axis direction, widths 541b and 542b in the y-axis direction, and thicknesses (not illustrated) in the z-axis direction. Without being limited thereto, the first and second open stubs 541 and 542 may be designed in various different types in which the same can provide electrical parameters for removing the parasitic capacitance of the frequency adjustment module 400.

According to an embodiment, the first and second open stubs 541 and 542 may be designed by utilizing a microstrip. Referring to FIG. 5E, the printed circuit board 500e (for example, a part of 340 in FIG. 3 or 500 in FIG. 5A) may include a structure in which a flat first conductor 570 and a second conductor (for example, ground plane) 580 wider than the first conductor 570 are fixed by a dielectric material 590. The first conductor 570 supported in parallel with the second conductor 580 may be utilized as an open stub. Equation 3, Equation 4, Equation 5, and Equation 6 are related to parameters regarding design of the first conductor 570.

$$E_e = \frac{E_r + 1}{2} + \frac{E_r - 1}{2} \frac{1}{\sqrt{1 + 12h/W}} \quad \text{[Equation 3]}$$

($E_e$: effective dielectric constant, $E_r$: specific dielectric constant)

$$Z_0 = \frac{30}{\sqrt{E_e}} \ln\left(\frac{8h}{W} + \frac{W}{4h}\right) \quad W/h \leq 1 \quad \text{[Equation 5]}$$

$$Z_0 = \frac{120\pi}{\sqrt{E_e}\,[W/h + 1.393 + 0.667 \ln(W/h + 1.444)]} \quad W/h \geq 1 \quad \text{[Equation 6]}$$

($Z_0$: impedance, c=3*108 m/sec, L: inductance, C: capacitance, $V_p$: peak value, $E_r$: specific dielectric constant)

$$Z_0 = \sqrt{\frac{L}{C}} = \sqrt{\frac{LC}{C}} = \frac{1}{V_p C} = \frac{\sqrt{E_r}}{cC} \quad \text{[Equation 4]}$$

Referring to Equation 3, Equation 4, Equation 5, and Equation 6, if the width W of the first conductor 570 increases, the inductance of the first conductor 570 may decrease, and the capacitance of the first conductor 570 may increase. If the width W of the first conductor 570 decreases, the inductance of the first conductor 570 may increase, and the capacitance of the first conductor 570 may decrease. If the specific dielectric constant $E_r$ increases, the capacitance of the first conductor 570 may increase, and if the specific dielectric constant $E_r$ decreases, the capacitance of the first conductor 570 may decrease. If the height h of the dielectric material 590 increases, the inductance of the first conductor 570 may increase, and the capacitance of the first conductor 570 may decrease. If the height h of the dielectric material 590 decreases, the inductance of the first conductor 570 may decrease, and the capacitance of the first conductor 570 may increase. The impedance of the first conductor 570 may vary according to the width W of the first conductor 570. For example, if the width W of the first conductor 570 increases, the impedance of the first conductor 570 may decrease, and if the width W of the first conductor 570 decreases, the impedance of the first conductor 570 may increase. In view thereof, a first conductor 570 for the first and second open stubs 541 and 542 in FIG. 5A may be designed.

Figure 6A:
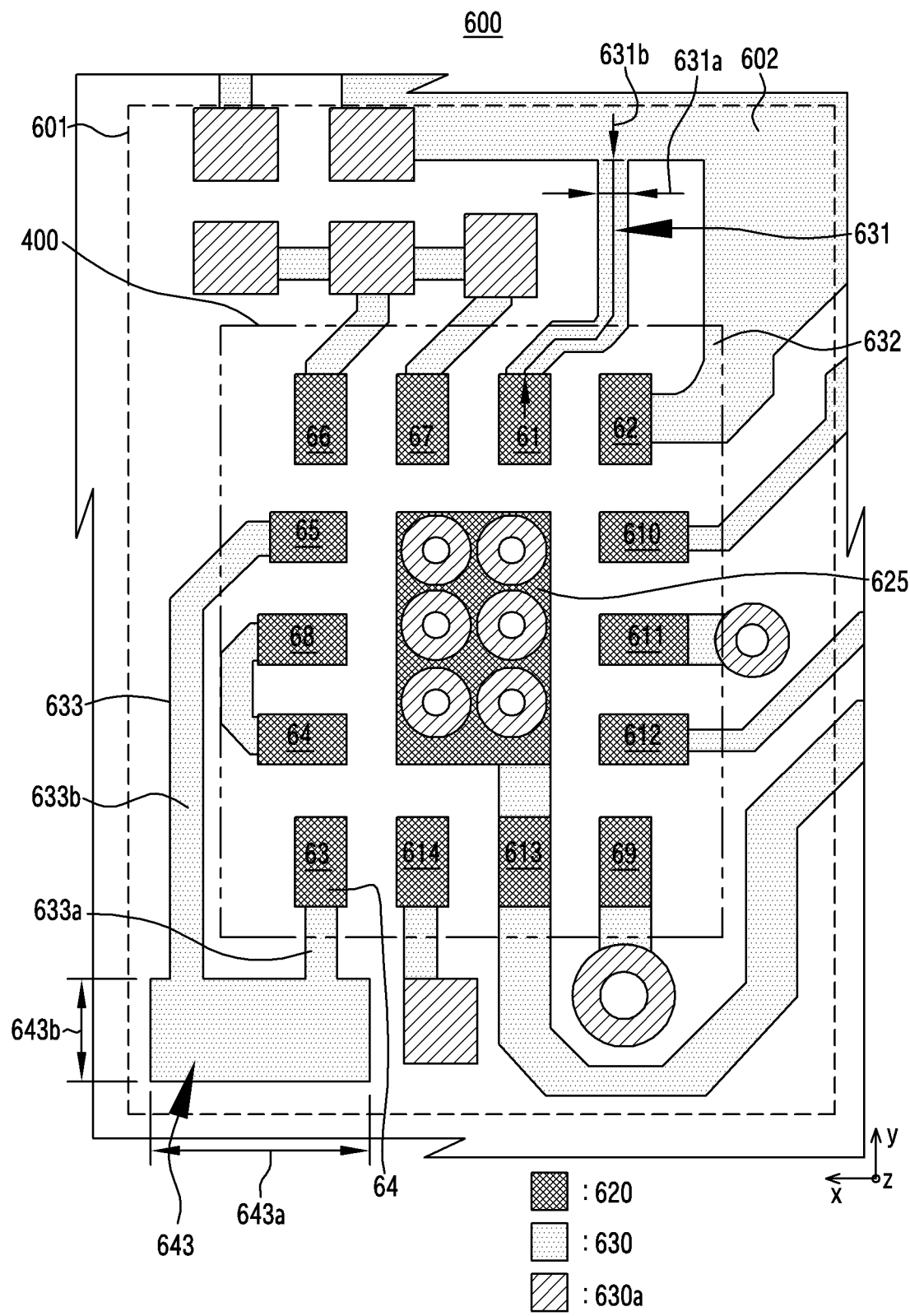
FIG. 6A illustrates a printed circuit board for removing a parasitic element of a frequency adjustment module according to an embodiment.
Figure 6B:
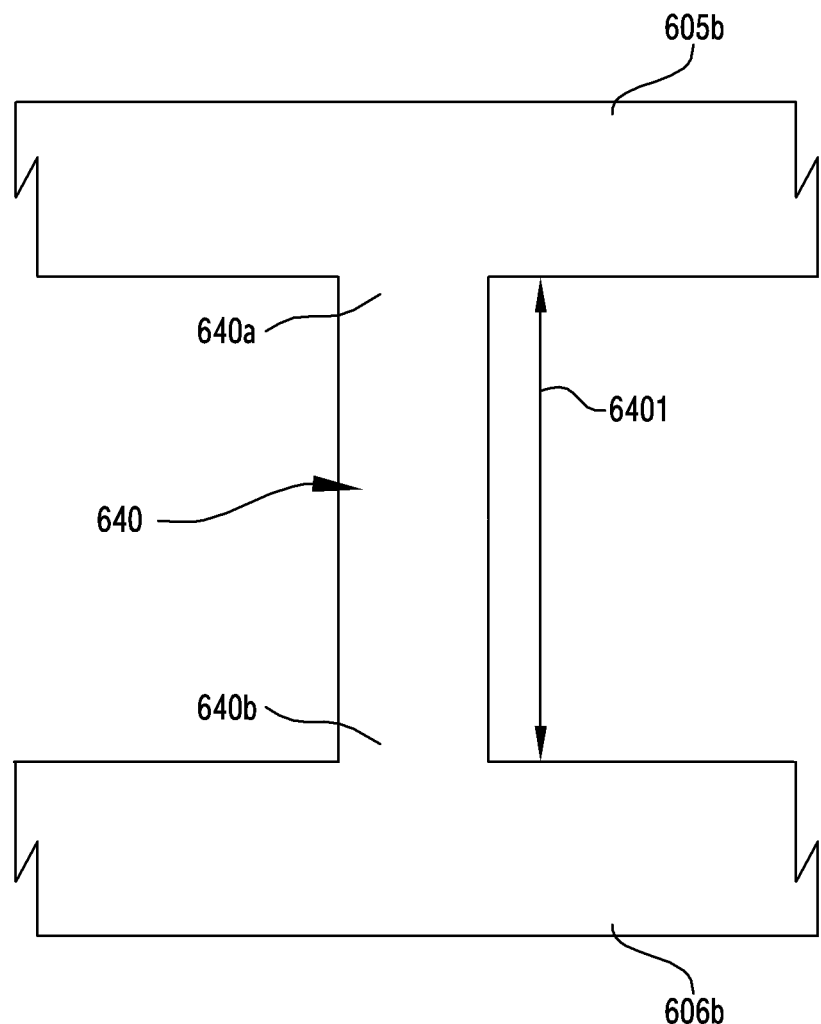
FIG. 6B schematically illustrates the structure of a short stub according to an embodiment.
Figure 6C:
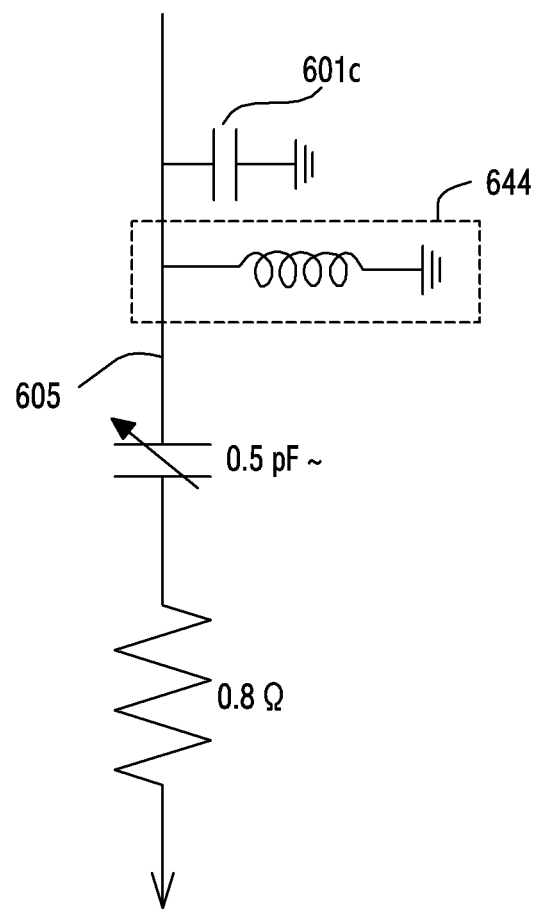
FIG. 6C illustrates an equivalent circuit when a short stub is applied to a transmission line utilizing a frequency adjustment module.

FIG. 6A illustrates a printed circuit board for removing a parasitic element of a frequency adjustment module according to an embodiment. FIG. 6B schematically illustrates the structure of a short stub according to an embodiment. FIG. 6C illustrates an equivalent circuit when a short stub is applied to a transmission line utilizing a frequency adjustment module. At least one of the components of the printed circuit board 600 may be identical or similar to at least one of the components of the printed circuit 500 in FIG. 5A, and repeated descriptions thereof will be omitted herein.

Referring to FIG. 4A and FIG. 6A, the printed circuit board 600 may include a first area 601 (for example, 501 in FIG. 5A) regarding a frequency adjustment module 400. The first area 601 may include conductive lands 620 (for example, 520 in FIG. 5A) to which multiple terminals 401 of the frequency adjustment module 400 are coupled, a ground 625 (for example, 525 in FIG. 5A) surrounded by the conductive lands 620 and coupled to the ground 402 of the frequency adjustment module 400 by using soldering, and electrical paths 630 (for example, 530 in FIG. 5A) extending from the conductive lands 620. For example, the conductive lands 620 may include a first land 61, a second land 62, a third land 63, a fourth land 64, a fifth land 65, a sixth land 66, a seventh land 67, an eighth land 68, a ninth land 69, a tenth land 610, an $11^{th}$ land 611, a $12^{th}$ land 612, a $13^{th}$ land 613, and a $14^{th}$ land 614, which are similar or identical to the conductive lands 520 in FIG. 5A, respectively. The electrical paths 630 may include parts 630a (for example, 530a in FIG. 5A) disposed on an end of an electrical path or disposed between electrical paths.

According to an embodiment, the first area 601 may include a first electrical path 631 connected to the first land 61. If the frequency adjustment module 400 is mounted on the printed circuit board 600, the first conductive pad 4011 of the frequency adjustment module 400 may be electrically connected to the first land 61 of the first area 601.

According to an embodiment, the first area 601 may include a second electrical path 632 connected to the second land 62. If the frequency adjustment module 400 is mounted on the printed circuit board 600, the second conductive pad 4012 of the frequency adjustment module 400 may be electrically connected to the second land 62 of the first area 601. According to an embodiment, the second electrical path 632 may be connected to the ground plane 602 of the printed circuit board 600. The ground plane 602 may be defined as a part of the second electrical path 632.

According to an embodiment, the first electrical path 631 may be designed as a short stub. The first electrical path 631 may be electrically shorted to the second electrical path 632.

Referring to FIG. 6B, the short stub 640 (for example, first electrical path 631) may be defined so as to include an end portion 640a connected to a transmission line 605 (for example, 405 in FIG. 4A) and another end portion 640b which extends from the end portion 640a, and which is connected to a ground plane 606b (for example, 602 in FIG. 6A). The input impedance of the short stub 640 with regard to the transmission line 605b may vary depending on the length 6401 of the short stub 640. Equation 7 is related to the input impedance of the short stub 640.

$$Z_{in} = jZ_0 \cot \beta l \qquad \text{[Equation 7]}$$

($Z_{in}$: input impedance, l: length, $\beta$: phase constant [rad/m])

$$\beta = 2\pi/\lambda_g \qquad \text{[Equation 8]}$$

($\lambda_g$: wavelength on transmission line)

Referring to Equations 7 and 8, if the length 6401 of the short stub 640 is smaller than $\lambda/4$, the short stub 640 may operate as an inductor, and if the length 6401 of the short stub 640 is larger than $\lambda/4$ and smaller than $\lambda/2$, the short stub 640 may operate as a capacitor. If the length 6401 of the short stub 640 is $\lambda/4$, $3\lambda/4$, $5\lambda/4$, or the like, the short stub 640 may operate as a band pass filter (BPF). The first electrical path 631 in FIG. 6A may take a conceptual structure like the short stub 640 defined with reference to FIG. 6B. The first electrical path 631 may provide the transmission line with electrical parameters such as resistance, inductance, capacitance, and the like. This enables the first electrical path 631 to reduce the parasitic capacitance of the frequency adjustment module (for example, 400 in FIG. 4A). In an embodiment, referring to FIG. 4A and FIG. 6C, the first electrical path 631 operating as an inductor (for example, parallel inductor) may reduce the parasitic capacitance 601c of the frequency adjustment module 400 (for example, parasitic capacitance produced while the third witching element SW3 is turned off).

According to various embodiments, the short stub 640 may be disposed in various different positions of conductive patterns of the first area 601 with regard to the transmission line 405, thereby removing the parasitic capacitance of the frequency adjustment module 400.

In an embodiment, the first electrical path 631 in FIG. 6A may be a thin plate having a width 631a, a length 631b, and a thickness (not illustrated). According to an embodiment, the first electrical path 631 may be designed by utilizing a microstrip described with reference to FIG. 5E, and the type thereof may be designed to have a specific electrical parameter based on Equation 3, Equation 4, Equation 5, and Equation 6.

According to an embodiment, the first area 601 may include a third electrical path 633 electrically connecting between the third land 63 and the fifth land 65. If the frequency adjustment module 400 is mounted on the printed circuit board 600, the third conductive pad 4013 of the frequency adjustment module 400 may be electrically connected to the third land 63 of the first area 601, and the fifth conductive land 4015 of the frequency adjustment module 400 may be electrically connected to the fifth land 65 of the first area 601. The third electrical path 633 may include an open stub 643 (hereinafter, referred to as third open stub). According to an embodiment, the third open stub 643 may be a part of the third electrical path 633, which has a relatively large width 643b. The third open stub 643 may be disposed near the third land 63, and the third land 63 may be disposed between the fourth land 64 and the third open stub 643. The third electrical path 633 may include a path 633a which is connected to the third land 63, and which extends in the y-axis direction, and a path 633b which is connected to the third open stub 643, and which extends in the y-axis direction. The third open stub 643 may take a conceptual structure like the open stub 540 defined with reference to FIG. 5B. The input impedance of the third open stub 643 may vary depending on the length of the third open stub 643 (for example, with 643a in the x-axis direction or width 643b in the y-axis direction). As described above with reference to Equation 1 and Equation 2, if the length 643a or 643b of the third open stub 643 is smaller than $\lambda/4$, the third open stub 643 may operate as a capacitor, and if the length 643a or 643b of the third open stub 643 is larger than $\lambda/4$ and smaller than $\lambda/2$, the third open stub 643 may operate as an inductor. If the length 643a or 643b of the third open stub 643 is $\lambda/4$, $3\lambda/4$, $5\lambda/4$, or the like, the third open stub 643 may operate as a band elimination filter (BEF). According to various embodiments, the third open stub 643 may be disposed in various different positions of conductive patterns of the first area 601 with regard to the transmission line, thereby removing the parasitic capacitance of the frequency adjustment module 400. In an embodiment, referring to FIG. 4A and FIG. 6C, the third open stub 643 operating as an inductor may reduce the parasitic capacitance 601c of the frequency adjustment module 400 (for example, parasitic capacitance produced while the second switching element SW2 is turned off).

According to an embodiment, an impedance corresponding to a designated frequency (for example, frequency designated in the corresponding communication mode) between the frequency adjustment module 400 and stubs (for example, first electrical path (or short stub) 631 or open stub 643) may be formed. The impedance corresponding to the designated frequency may have substantially the same magnitude as that of the impedance of the antenna.

Figure 7:
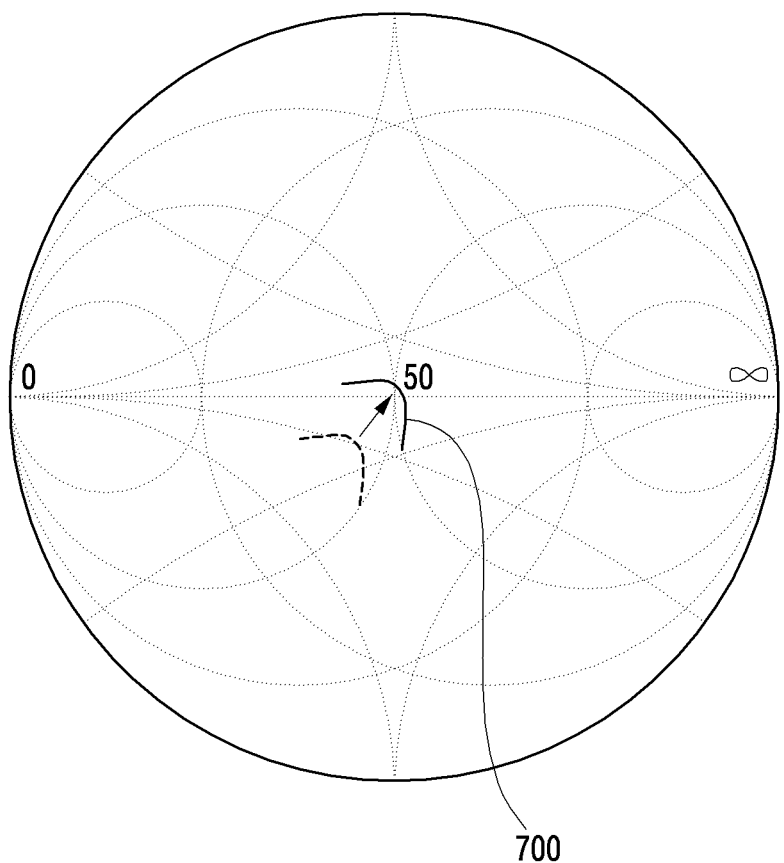
FIG. 7 is a Smith chart before and after applying a passive circuit implemented as an open stub or a short stub on a printed circuit board to a transmission line utilizing a frequency adjustment module.

FIG. 7 is a Smith chart before and after applying a passive circuit implemented as an open stub or a short stub on a printed circuit board to a transmission line utilizing a frequency adjustment module.

Referring to FIG. 7, if a passive circuit implemented as an open stub or a short stub on a printed circuit board is applied to a transmission line utilizing a frequency adjustment module, the impedance 700 of the transmission line may match with the impedance (for example, 50 ohm) of an antenna.

Figure 8A:
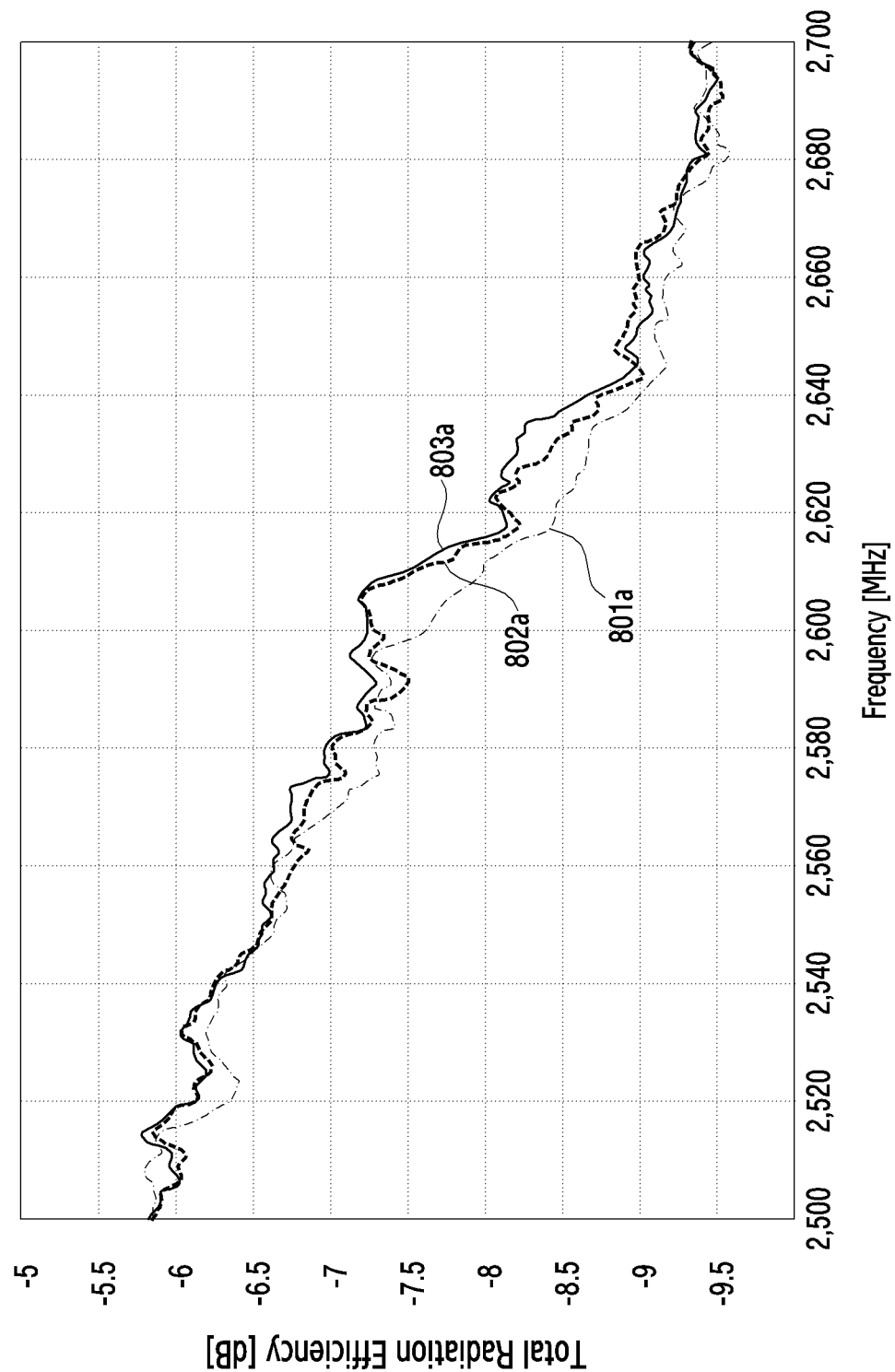
FIG. 8A and FIG. 8B are graphs illustrating the antenna performance of an electronic device configured such that a passive circuit implemented as an open stub on a printed circuit board is applied to a transmission line utilizing a frequency adjustment module and the antenna performance of an electronic device configured such that the same is not applied, respectively, in a communication mode of a high band (HB) using a frequency of about 2200-2700 MHz.
Figure 8B:
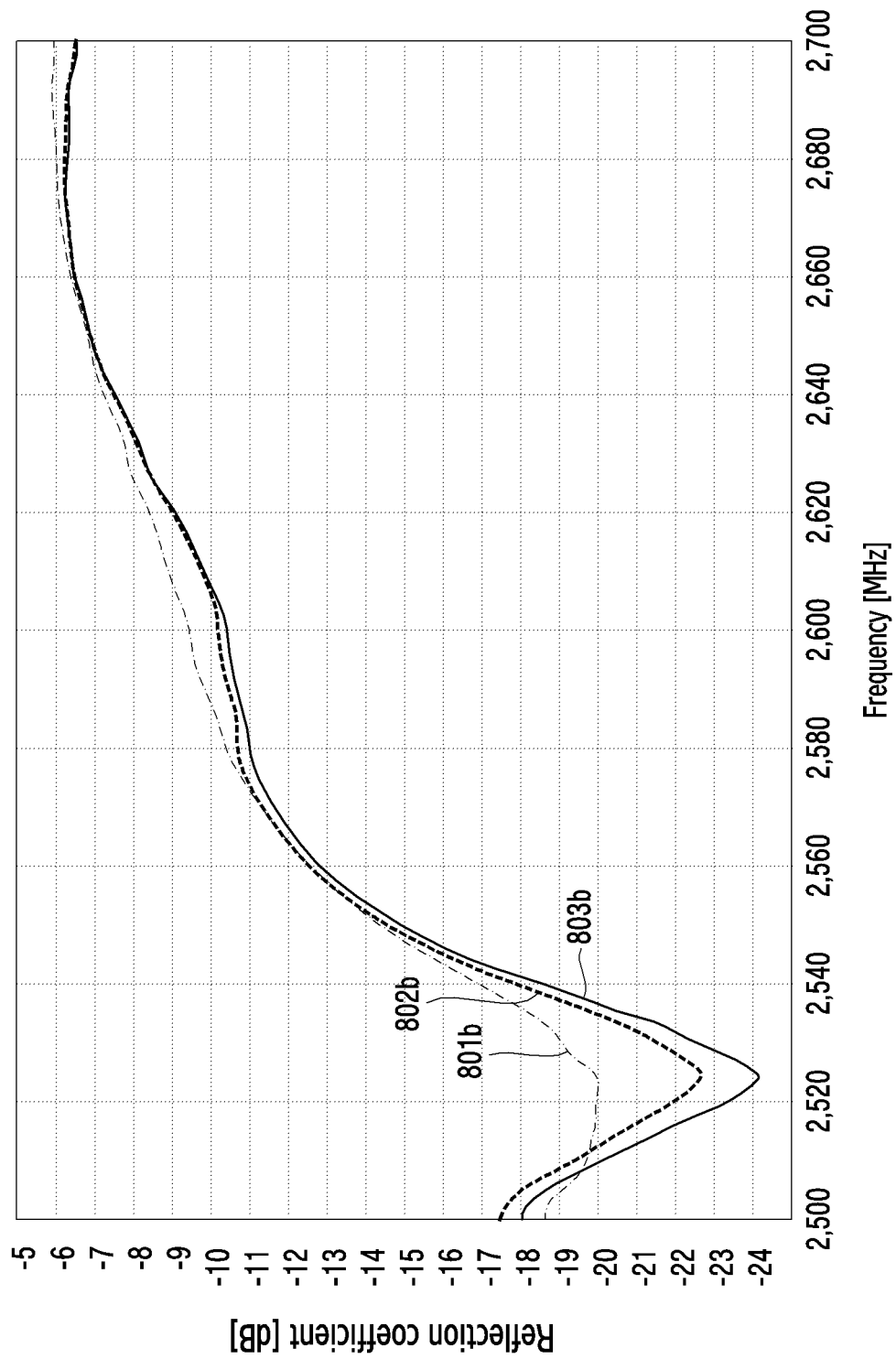
Figure 9A:
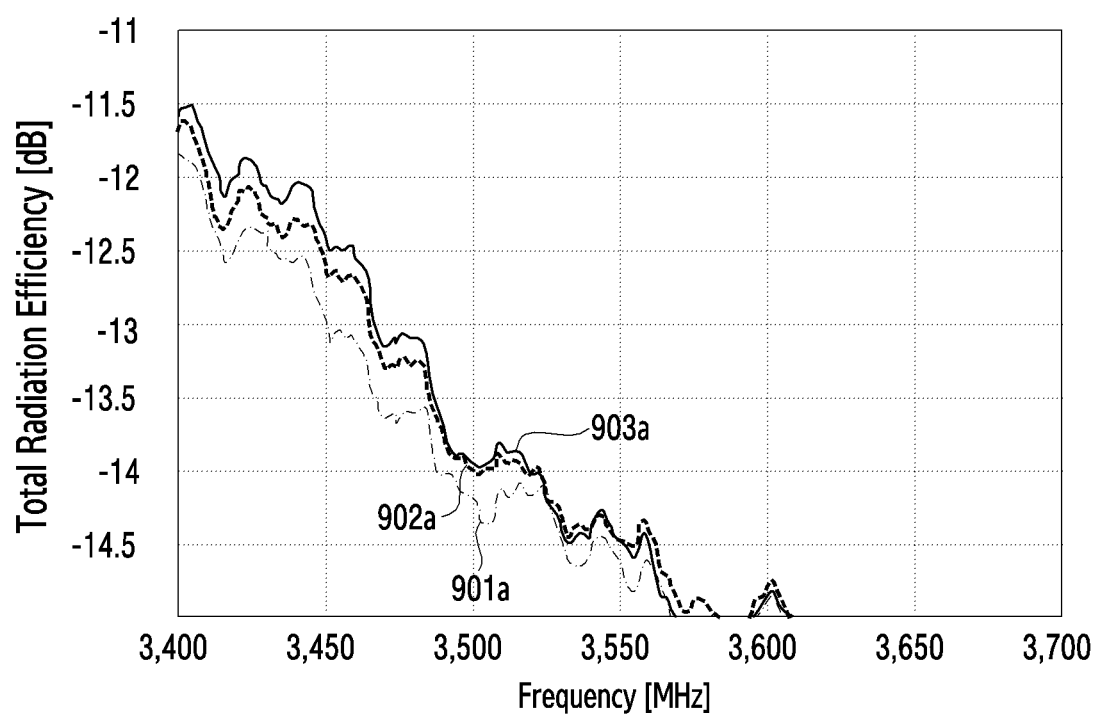
FIG. 9A and FIG. 9B are graphs illustrating the antenna performance of an electronic device configured such that a passive circuit implemented as an open stub on a printed circuit board is applied to a transmission line utilizing a frequency adjustment module and the antenna performance of an electronic device configured such that the same is not applied, respectively, in a communication mode of an ultra-high band (UHB) using a frequency of about 2700-3600 MHz.
Figure 9B:
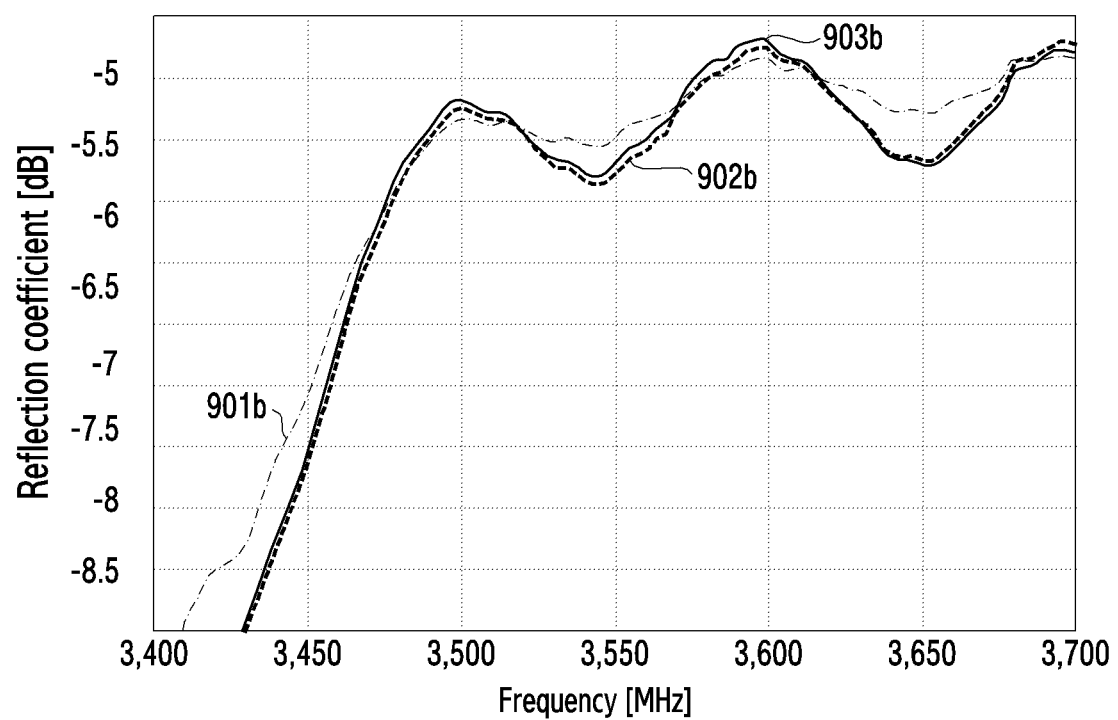

FIG. 8A and FIG. 8B are graphs illustrating the antenna performance of an electronic device configured such that a passive circuit implemented as an open stub on a printed circuit board is applied to a transmission line utilizing a frequency adjustment module (hereinafter, referred to as "first electronic device") and the antenna performance of an electronic device configured such that the same is not applied (hereinafter, referred to as "second electronic device"), respectively, in a communication mode of a high band (HB) using a frequency of about 2200-2700 MHz. FIG. 9A and FIG. 9B are graphs illustrating the antenna performance of the first electronic device configured such that a passive circuit implemented as an open stub on a printed circuit board is applied to a transmission line utilizing a frequency adjustment module and the antenna performance of the second electronic device configured such that the same is not applied, respectively, in a communication mode of an ultrahigh band (UHB) using a frequency of about 3300-3700 MHz or using a frequency of about 2700-3600 MHz. FIG. 8A, FIG. 8B, FIG. 9A, and FIG. 9B will be described with reference to FIG. 4A, FIG. 4B, and FIG. 4C.

Referring to FIG. 8A and FIG. 8B, reference numerals 801a and 801b refer to the radiation efficiency and the reflection coefficient of a second electronic device in the communication mode of the HB, respectively. Reference numerals 802a and 802b refer to the radiation efficiency and the reflection coefficient of a first electronic device configured such that an open stub for removing the parasitic capacitance (for example, about 0.45 pF) while a first switching element SW1 is turned off is applied to a transmission line, in the communication mode of the HB, respectively. Reference numerals 803a and 803b refer to the radiation efficiency and the reflection coefficient of another first electronic device configured such that an open stub for removing the parasitic capacitance (for example, about 0.25 pF) while a third switching element SW3 is turned off is applied to a transmission line, in the communication mode of the HB, respectively. In the communication mode of the HB, the first electronic device may, in general, have a higher radiation efficiency and a smaller reflection coefficient than the second electronic device.

Referring to FIG. 9A and FIG. 9B, reference numerals 901a and 901b refer to the radiation efficiency and the reflection coefficient of a second electronic device in the communication mode of the UHB, respectively. Reference numerals 902a and 902b refer to the radiation efficiency and the reflection coefficient of a first electronic device configured such that an open stub for removing the parasitic capacitance (for example, about 0.45 pF) while a first switching element SW1 is turned off is applied to a transmission line, in the communication mode of the UHB, respectively.

Reference numerals 903a and 903b refer to the radiation efficiency and the reflection coefficient of another first electronic device configured such that an open stub for removing the parasitic capacitance (for example, about 0.25 pF) while a third switching element SW3 is turned off is applied to a transmission line, in the communication mode of the UHB, respectively. In the communication mode of the UHB, the first electronic device may, in general, have a higher radiation efficiency and a smaller reflection coefficient than the second electronic device.

Referring to FIG. 8A, FIG. 8B, FIG. 9A, and FIG. 9B, the first electronic device configured such that an open stub is applied to a transmission line has a larger degree of antenna performance improvement in the communication mode of the UHB that uses a higher frequency than in the communication mode of the HB. This may mean that the higher frequency used by the communication mode, the larger influence the parasitic element of the frequency adjustment module has on the antenna performance. According to various embodiments, it is obvious that, in various other communication modes using higher frequencies than the UHB, a passive circuit implemented as an open stub or a short stub on a printed circuit board is applicable to a transmission line utilizing a frequency adjustment module.

Figure 10A:
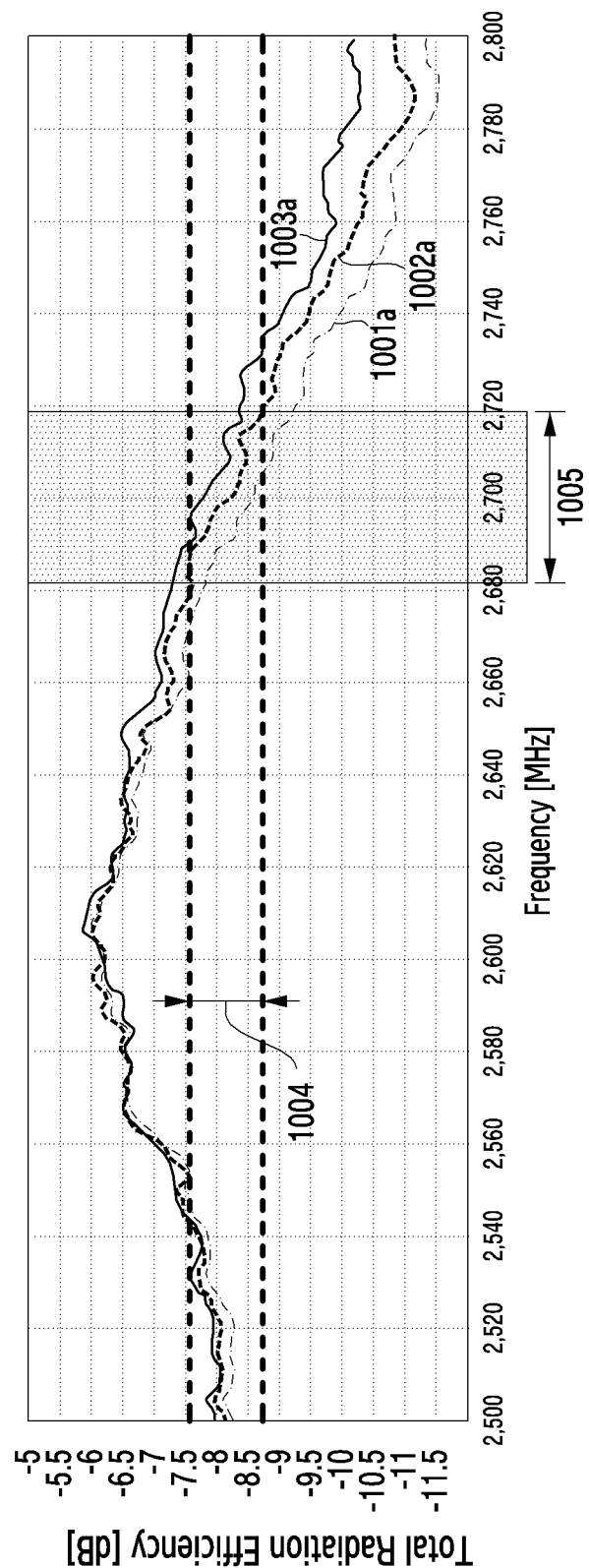
FIG. 10A and FIG. 10B are graphs illustrating the antenna performance of an electronic device configured such that a passive circuit implemented as an open stub or a short stub on a printed circuit board is applied to a transmission line utilizing a frequency adjustment module and the antenna performance of an electronic device configured such that the same is not applied, respectively, in a communication mode of the HB.
Figure 10B:
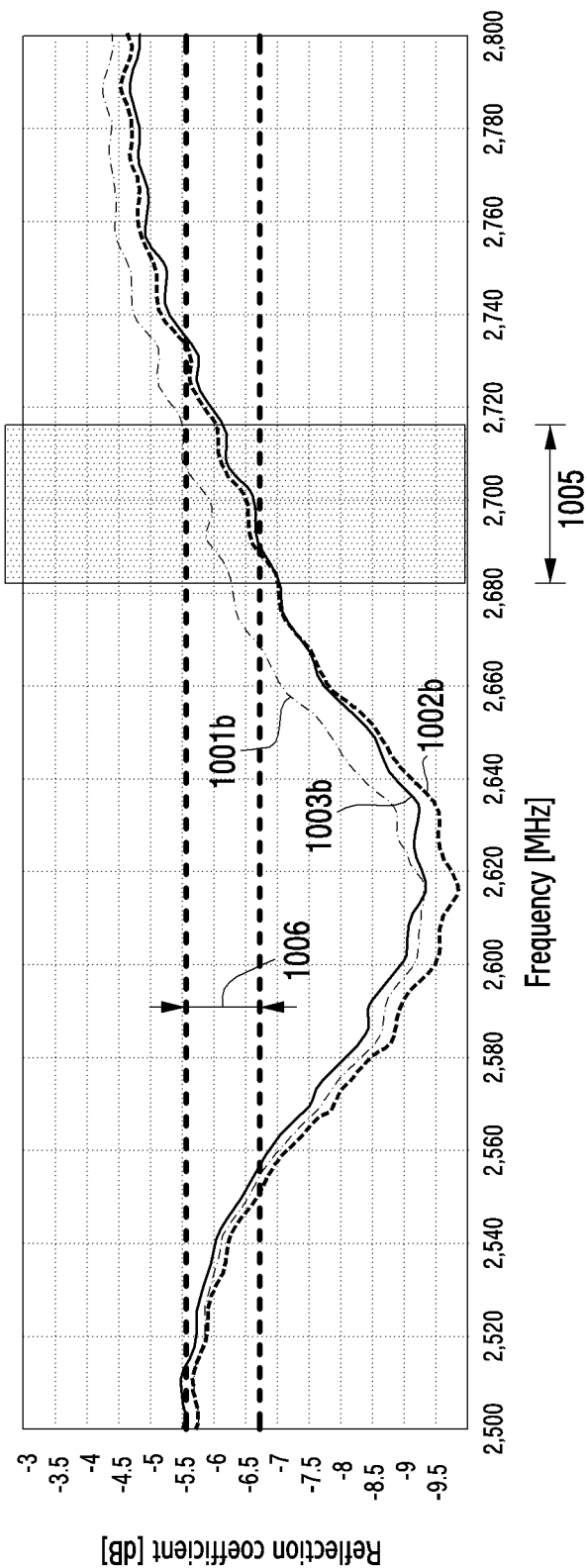
Figure 10C:
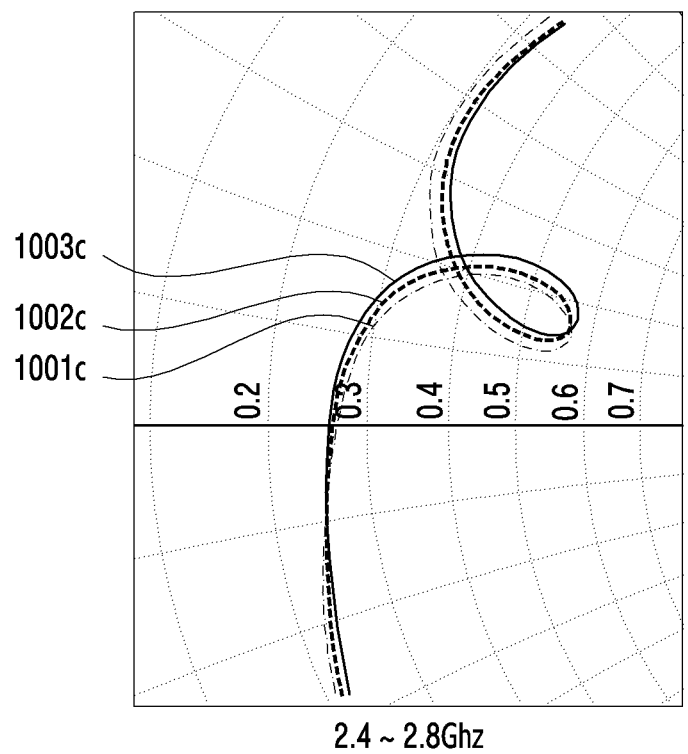
FIG. 10C is a Smith chart regarding a transmission line to which a passive circuit implemented as an open stub or a short stub on a printed circuit board is applied, and a transmission line to which the same is not applied, in a communication mode of the HB.

FIG. 10A and FIG. 10B are graphs illustrating the antenna performance of an electronic device configured such that a passive circuit implemented as an open stub or a short stub on a printed circuit board is applied to a transmission line utilizing a frequency adjustment module (hereinafter, referred to as "third electronic device") and the antenna performance of an electronic device configured such that the same is not applied (hereinafter, referred to as "fourth electronic device"), respectively, in a communication mode of the UHB. FIG. 10C is a Smith chart regarding a transmission line to which a passive circuit implemented as an open stub or a short stub on a printed circuit board is applied, and a transmission line to which the same is not applied, in a communication mode of the HB. FIG. 10A, FIG. 10B, and FIG. 10C will be described with reference to FIG. 4A, FIG. 4B, and FIG. 4C.

Referring to FIG. 10A and FIG. 10B, reference numerals 1001a and 1001b refer to the radiation efficiency and the reflection coefficient of a fourth electronic device in the communication mode of the HB, respectively. Reference numerals 1002a and 1002b refer to the radiation efficiency and the reflection coefficient of a third electronic device configured such that a short stub for removing the parasitic capacitance (for example, about 0.45 pF) while a first switching element SW1 is turned off is applied to a transmission line, in the communication mode of the HB, respectively. Reference numerals 1003a and 1003b refer to the radiation efficiency and the reflection coefficient of another third electronic device configured such that an open stub for removing the parasitic capacitance (for example, about 0.25 pF) while a second switching element SW2 is turned off is applied to a transmission line, in the communication mode of the HB, respectively. In the HB, the third electronic device may, in general, have a higher radiation efficiency and a smaller reflection coefficient than the fourth electronic device. For example, referring to FIG. 10A, a comparison between 1001a and 1003a in the corresponding frequency band 1005 shows that the third electronic device may have a radiation efficiency improved by about 1 dB 1004 than the fourth electronic device. For example, referring to FIG. 10B, a comparison between 1001b and 1003b in the corresponding frequency band 1005 shows that the third electronic device may have a reflection coefficient smaller by about 1 dB 1006 than the fourth electronic device.

Referring to FIG. 10C, reference numeral 1001c refers to the impedance regarding the transmission line of a fourth electronic device in the communication mode of the HB. Reference numeral 1002c refers to the impedance regarding the transmission line of a third electronic device configured such that a short stub for removing the parasitic capacitance (for example, about 0.45 pF) while a first switching element SW1 is turned off is applied thereto, in the communication mode of the HB. Reference numeral 1003c refers to the impedance regarding the transmission line of another third electronic device configured such that an open stub for removing the parasitic capacitance (for example, about 0.25 pF) while a second switching element SW2 is turned off is applied thereto, in the communication mode of the HB. The transmission line configured such that a short stub or an open stub formed on a printed circuit board is applied thereto may have a value matching with the impedance (for example, about 50 ohm) of the antenna or substantially matching therewith, compared with a transmission line configured otherwise.

Figure 11:
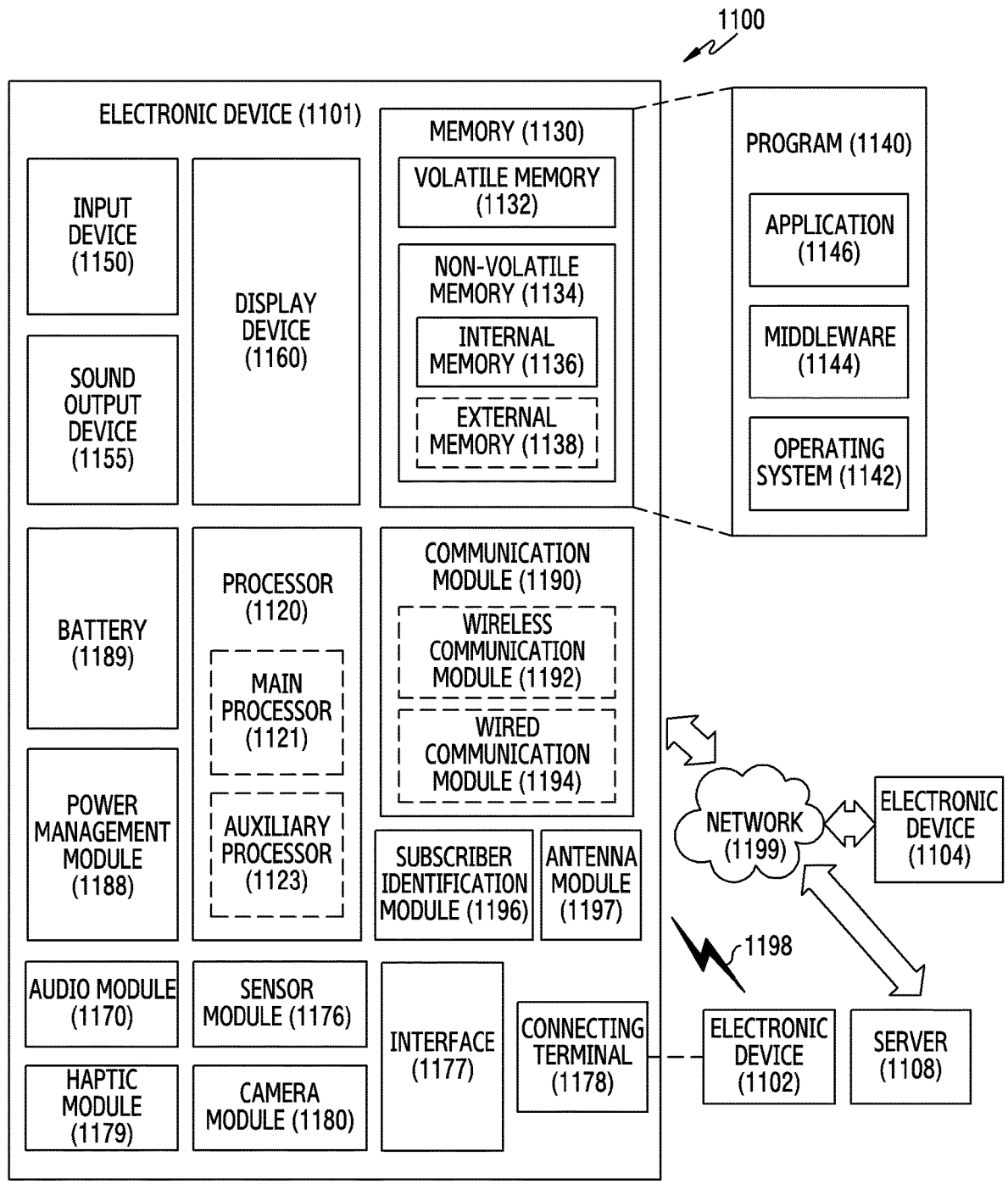
FIG. 11 is a block diagram of an electronic device inside a network environment according to various embodiments.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments, at least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other component (e.g., the processor 1120) of the electronic device 1101, from the outside (e.g., a user) of the electronic device 1101. The input device 1150 may include, for example, a microphone, a mouse, a keyboard, or a digital pen (e.g., a stylus pen).

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., PCB). According to an embodiment, the antenna module 1197 may include a plurality of antennas. In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

The electronic device 1101 may include a printed circuit board (for example, 340 in FIG. 3) on which a communication module 1190, an antenna module 1197, and the like are mounted. According to an embodiment, a frequency adjustment module (for frequency adjustment element) (for example, 400 in FIG. 4A) for adjusting the resonance frequency of the antenna module 1197 may be mounted on the printed circuit board. The frequency adjustment module may be provided in a chip type, and multiple terminals of the chip may be coupled to the printed circuit board by using an SMT. The printed circuit board may have an area having conductive patterns related to the frequency adjustment module (hereinafter, referred to as "first area"). The first area may include conductive lands coupled to multiple terminals of the frequency adjustment module by soldering, and electrical paths connected to the conductive lands. The electrical paths in the first area may be electrically connected to a wireless communication module 1192 disposed in a different position from the first area, an antenna module 1197, a ground, or the like. The wireless communication module 1192 may acquire a signal from the processor 1120, and may transmit the acquired signal to external electronic devices 1102, 1104, and 1108 through the antenna module 1197. The wireless communication module 1192 may receive a signal sent from the external electronic devices 1102, 1104, and 1108 through the antenna module 1197, and may provide the received signal to the processor 1120. The wireless communication module 1192 may transmit a signal to the external electronic devices 1102, 1104, and 1108 through an antenna appropriate for the communication scheme, or receive a signal from the external electronic devices 1102, 1104, and 1108. According to an embodiment, the frequency adjustment module may move the resonance frequency of the antenna to a designated frequency under the control of the wireless communication module 1192 or the processor 1120, in order to support the corresponding communication, or move the resonance frequency of the antenna by a designated amount.

The frequency adjustment module (for example, 400 in FIG. 4A) may have a parasitic element resulting from the element characteristics. According to an embodiment, the electronic device 1101 may include a passive circuit for reducing the parasitic element (for example, parasitic capacitance) of the frequency adjustment module, and such a passive circuit may be formed by at least some of the conductive patterns disposed in the first area of the printed circuit board. According to an embodiment, the passive circuit may be an open stub (for example, 541 or 542 in FIG. 5A or 643 in FIG. 6A) or a short stub (for example, 631 in FIG. 6A), which is connected to at least one of conductive lands coupled to the frequency adjustment module, and which is disposed to form an impedance corresponding to the frequency adjustment module. If the parasitic element of the frequency adjustment module is removed by the open stub or the short stub, the impedance of the transmission line may match with the impedance of the antenna, and this may enable efficient signal transfer while minimizing power loss at a specific frequency. According to an embodiment, an impedance corresponding to a designated frequency between the frequency adjustment module and the stubs may be formed, and this impedance may have substantially the same magnitude as that of the impedance of the antenna.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above. In this document, the term "user" may refer to a person using the electronic device, or a device (for example, artificial intelligence electronic device) using the electronic device.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 12:
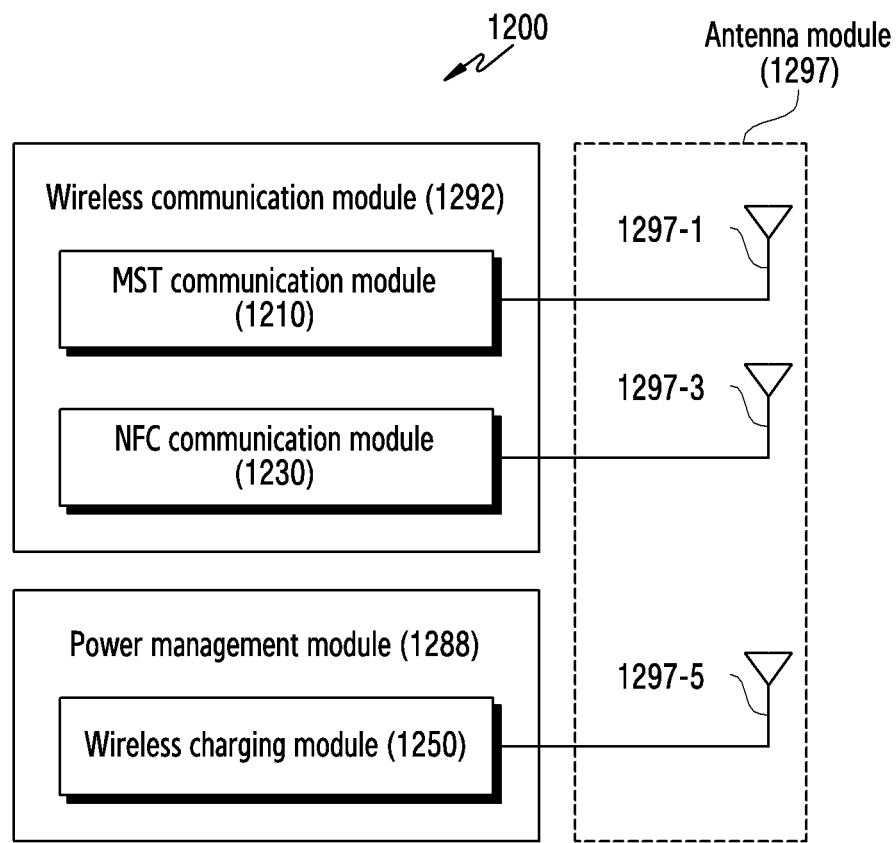
FIG. 12 is a block diagram regarding a wireless communication module, a power management module, and an antenna module of an electronic device according to various embodiments.

FIG. 12 is a block diagram 1200 regarding a wireless communication module 1192, a power management module 1188, and an antenna module 1197 of an electronic device 1101. Referring to FIG. 12, the wireless communication module 1192 may include an MST communication module 1210 or an NFC communication module 1230, and the power management module 1188 may include a wireless charging module 1250. In this case, the antenna module 1297 may separately include multiple antennas including an MST antenna 1297-1 connected to the MST communication module 1210, an NFC antenna 1297-3 connected to the NFC communication module 1230, and a wireless charging antenna 1297-5 connected to the wireless charging module 1250. For convenience of description, descriptions of components already described with reference to FIG. 11 will be omitted or made briefly.

The MST communication module 1210 may receive a signal (for example, signal including control information or payment information) from the processor 1120, may produce a magnetic signal corresponding to the received signal through the MST antenna 1297-1, and may transfer the produced magnetic signal to an external electronic device 1102 (for example, POS device). According to an embodiment, for example, the MST communication module 1210 may include a switching module (not illustrated) including one or more switches connected to the MST antenna 1297-1, and may change the direction of the voltage or current supplied to the MST antenna 1297-1 by controlling the switching module. This may be emitted through the MST antenna 1297-1, thereby changing the direction of a magnetic signal (for example, magnetic field) transferred to the external electronic device 1102 through wireless short-range communication 1198, for example. The magnetic signal transferred with the changed direction may cause a magnetic field having a type and an effect similar to those of a magnetic field produced when a magnetic card is swiped by a card reader of the electronic device 1102. According to an embodiment, payment-related information and a control signal received by the electronic device 1102 in the magnetic signal type may be transmitted to a payment server (for example, server 1108) through a network 1199, for example.

The NFC communication module 1230 may acquire a signal (for example, signal including control information or payment information) from the processor 1120 and may transmit the acquired signal to the external electronic device 1102 through the NFC antenna 1297-3. According to an embodiment, the NFC communication module 1230 may receive a signal (for example, signal including control information or payment information) sent from the external electronic device 1102 through the NFC antenna 1297-3.

The wireless charging module 1250 may wirelessly transmit power to the external electronic device 1102 (for example, mobile phone or wearable device) through the wireless charging antenna 1297-5, or may wirelessly receive power from the external electronic device 1102 (for example, wireless charging device). The wireless charging module 1250 may support various wireless charging schemes, including a magnetic resonance scheme or a magnetic induction scheme, for example.

According to an embodiment, at least some of the MST antenna 1297-1, the NFC antenna 1297-3, or the wireless charging antenna 1297-5 may share at least a part of a radiator with each other. For example, the radiator of the MST antenna 1297-1 may be used as the radiator of the NFC antenna 1297-3 or the wireless charging antenna 1207-5, and vice versa. When the MST antenna 1297-1, the NFC antenna 1297-3, or the wireless charging antenna 1297-5 shares at least a partial area of the radiator, the antenna module 1297 may include a switching circuit (not illustrated) for selectively connecting or disconnecting (for example, opening) at least some of the antennas 1297-1, 1297-3, or 1297-5 under the control of the wireless communication module 1192 (for example, MST communication module 1210 or NFC communication module 1230) or the power management module (for example, wireless charging module 1250). For example, when the electronic device 1101 uses a wireless charging function, the NFC communication module 1230 or the wireless charging module 1250 may control the switching circuit such that at least a partial area of the radiator shared by the NFC antenna 1297-3 and the wireless charging antenna 1297-5 is temporarily disconnected from the NFC antenna 1297-3 and connected only to the wireless charging antenna 1297-5.

According to an embodiment, at least a part of the function of the MST communication module 1210, the NFC communication module 1230, or the wireless charging module 1250 may be controlled by an external processor (for example, processor 1120). According to an embodiment, designated functions (for example, payment function) of the MST communication module 1210 or the NFC communication module 1230 may be performed in a trusted execution environment (TEE). The TEE according to various embodiments may be, for example, an execution environment in which at least a part of a designated area of the memory 1130 is assigned to perform a function requiring a relatively high level of security (for example, function related to financial transaction or person information), and access to the designated area is recognized according to the accessing entity or the application to be executed, for example, and then allowed limitedly.

According to an embodiment of the disclosure, an electronic device (for example, 100 in FIG. 1A or FIG. 1B) may include a printed circuit board (for example, 600 in FIG. 6A) including a conductive pattern, and a tuner (for example, frequency adjustment module 400 in FIG. 4A) mounted on the conductive pattern and electrically connected to the conductive pattern. The tuner 400 may include a ground 402, a first conductive pad 4011, a first switching element SW1 electrically connected between the ground 402 and the first conductive pad 4011, and a second conductive pad 4012 electrically separated from the ground 402. The conductive pattern may include a first electrical path 631 configured to electrically contact the first conductive pad 4011, and a second electrical path 632 configured to electrically contact the second conductive pad 4012 and electrically shorted to the first electrical path 631.

According to an embodiment of the disclosure, the second conductive pad 4012 may be immediately adjacent to the first conductive pad 4011.

According to an embodiment of the disclosure, the tuner 400 may include a third conductive pad 4013, a fourth conductive pad 4014, and a second switching element SW2 electrically connected between the third conductive pad 4013 and the fourth conductive pad 4014. The tuner 400 may include a fifth conductive pad 4015, a sixth conductive pad 4016, and a third switching element SW3 electrically connected between the fifth conductive pad 4015 and the sixth conductive pad 4016. The conductive pattern may further include a third electrical path 633 electrically connected between the third conductive pad 4013 and the fifth conductive pad 4015.

According to an embodiment of the disclosure, the third conductive pad 4013 may be immediately adjacent to the fourth conductive pad 4014.

According to an embodiment of the disclosure, the fifth conductive pad 4015 may be immediately adjacent to the sixth conductive pad 4016.

According to an embodiment of the disclosure, the fourth conductive pad 4014 and the fifth conductive pad 4015 are disposed between the third conductive pad 4013 and the sixth conductive pad 4016.

According to an embodiment of the disclosure, the first conductive pad 4011, the second conductive pad 4012, and the sixth conductive pad 4026 may be arranged in a first direction. The third conductive pad, the fourth conductive pad, the fifth conductive pad, and the sixth conductive pad may be arranged in a second direction perpendicular to the first direction.

According to an embodiment of the disclosure, an impedance corresponding to a designated frequency may be formed between the tuner 400 and the first electrical path 631.

According to an embodiment of the disclosure, an impedance corresponding to a designated frequency may be formed between the tuner 400 and the third electrical path 633.

According to an embodiment of the disclosure, the third electrical path 633 may include a rectangular area (for example, third open stub 643) having a relatively large width among the third electrical path 633.

According to an embodiment of the disclosure, the rectangular area 643 of the third electrical path 633 may be disposed near the third conductive pad 4013 or the fourth conductive pad 4014.

According to an embodiment of the disclosure, the rectangular area 643 may include an open stub.

According to an embodiment of the disclosure, the open stub may have an electrical length larger than λ/4 and smaller than λ/2.

According to an embodiment of the disclosure, an electronic device (for example, 100 in FIG. 1A or FIG. 1B) may include a printed circuit board (for example, 500 in FIG. 5A) including a conductive pattern, and a tuner (for example, frequency adjustment module 400 in FIG. 4A) mounted on the conductive pattern and electrically connected to the conductive pattern. The tuner 400 may include a ground 402, a first conductive pad 4011, a first switching element SW1 electrically connected between the ground 402 and the first conductive pad 4011, and a second conductive pad 4012 electrically separated from the ground 402. The conductive pattern may include a first electrical path (for example, fourth electrical path 534 in FIG. 5A) having an end portion electrically contacting the first conductive pad 4011 and having another end portion electrically open, and a second electrical path 632 having an end portion electrically contacting the second conductive pad 4012 and having another end portion electrically short-circuited.

According to an embodiment of the disclosure, the second conductive pad 4012 may be immediately adjacent to the first conductive pad 4011.

According to an embodiment of the disclosure, the tuner 400 may include a third conductive pad 4013, a fourth conductive pad 4014, and a second switching element SW2 electrically connected between the third conductive pad 4013 and the fourth conductive pad 4014. The tuner 400 may include a fifth conductive pad 4015, a sixth conductive pad 4016, and a third switching element SW3 electrically connected between the fifth conductive pad 4015 and the sixth conductive pad 4016. The conductive pattern may further include a third electrical path 533 electrically connected between the third conductive pad 4013 and the fifth conductive pad 4015.

According to an embodiment of the disclosure, an impedance corresponding to a designated frequency may be formed between the tuner 400 and the first electrical path (for example, fourth electrical path 534).

According to an embodiment of the disclosure, the other end portion of the first electrical path (for example, fourth electrical path 534) may include a rectangular area (for example, first open stub 541 in FIG. 5A) having a relatively large width.

According to an embodiment of the disclosure, an impedance corresponding to a designated frequency may be formed between the tuner 400 and the third electrical path 533.

According to an embodiment of the disclosure, the third electrical path 533 may include a rectangular area (for example, second open stub 542 in FIG. 5A) having a relatively large width among the third electrical path 533.

According to an embodiment of the disclosure, an electronic device (for example, 100 in FIG. 1A or FIG. 1B) may include an antenna (for example, 403 in FIG. 4A), a printed circuit board (for example, 500 in FIG. 5A or 600 in FIG. 6A), a frequency adjustment module (for example, 400 in FIG. 4A) mounted in a first area 501 or 601 of the printed circuit board 500 or 600 so as to adjust the resonance frequency of the antenna 403, and a communication circuit (for example, wireless communication circuit 404 in FIG. 4A) mounted in a second area of the printed circuit board 500 or 600 separated from the first area 501 or 601 so as to transmit or receive a signal by using the antenna 403. The first area 501 or 601 of the printed circuit board 500 or 600 may include conductive lands 520 or 620 coupled to the frequency adjustment module 400, and a stub 541, 542, 631, or 643 connected to at least one of the conductive lands 520 or 620 and disposed to form an impedance corresponding to the frequency adjustment module 400.

According to an embodiment of the disclosure, an impedance corresponding to a designated frequency may be formed between the frequency adjustment module 400 and the stub 541, 542, 631, or 643.

According to an embodiment of the disclosure, the impedance corresponding to the designated frequency may have substantially the same magnitude as that of the impedance of the antenna 403.

According to an embodiment of the disclosure, the stub may include an open stub 541, 542, or 643 or a short stub 631.

According to an embodiment of the disclosure, the open stub 541, 542, or 643 may have a length larger than λ/4 and smaller than λ/2.

According to an embodiment of the disclosure, the short stub 631 may have a length smaller than λ/4.

The disclosure has been described mainly with reference to preferred embodiments. A person skilled in the art to which the disclosure pertains could understand that the disclosure can be implemented in a modified form without deviating from the essential characteristics of the disclosure. Therefore, the disclosed embodiments are to be considered in a descriptive viewpoint, not a limiting viewpoint. The scope of the disclosure is defined by the claims, not the above descriptions, and all differences falling within an equivalent scope are to be interpreted as being included in the disclosure.

The invention claimed is:
1. An electronic device comprising:
a printed circuit board comprising a conductive pattern; and
a tuner mounted on the conductive pattern and electrically connected to the conductive pattern, wherein
the tuner comprises:
a ground;
a first conductive pad;
a first switching element electrically connected between the ground and the first conductive pad;
a second conductive pad electrically separated from the ground;
a third conductive pad;
a fourth conductive pad;
a second switching element electrically connected between the third conductive pad and the fourth conductive pad;
a fifth conductive pad;
a sixth conductive pad; and
a third switching element electrically connected between the fifth conductive pad and the sixth conductive pad,
wherein the conductive pattern comprises:
a first electrical path configured to electrically contact the first conductive pad;

a second electrical path configured to electrically contact the second conductive pad and electrically shorted to the first electrical path; and a third electrical path electrically connected between the third conductive pad and the fifth conductive pad.

2. The electronic device as claimed in claim 1, wherein the second conductive pad is immediately adjacent to the first conductive pad.

3. The electronic device as claimed in claim 1, wherein the third conductive pad is immediately adjacent to the fourth conductive pad, and the fifth conductive pad is immediately adjacent to the sixth conductive pad.

4. The electronic device as claimed in claim 1, wherein the fourth conductive pad and the fifth conductive pad are disposed between the third conductive pad and the sixth conductive pad.

5. The electronic device as claimed in claim 1, wherein the first conductive pad is disposed between the second conductive pad and the sixth conductive pad.

6. The electronic device as claimed in claim 5, wherein the first conductive pad, the second conductive pad, and the sixth conductive pad are arranged in a first direction, and the third conductive pad, the fourth conductive pad, the fifth conductive pad, and the sixth conductive pad are arranged in a second direction perpendicular to the first direction.

7. The electronic device as claimed in claim 1, wherein an impedance corresponding to a designated frequency is formed between the tuner and the third electrical path.

8. The electronic device as claimed in claim 7, wherein the third electrical path comprises a rectangular area having a relatively large width among the third electrical path.

9. The electronic device as claimed in claim 8, wherein the rectangular area of the third electrical path is disposed near the third conductive pad or the fourth conductive pad.

10. The electronic device as claimed in claim 8, wherein the rectangular area comprises an open stub.

11. The electronic device as claimed in claim 10, wherein the open stub has a length larger than $\lambda/4$ and smaller than $\lambda/2$.

12. The electronic device as claimed in claim 1, wherein an impedance corresponding to a designated frequency is formed between the tuner and the first electrical path.

13. The electronic device as claimed in claim 1, wherein the first electrical path comprises a short stub.

14. The electronic device as claimed in claim 13, wherein the short stub has an electrical length smaller than $\lambda/4$.

* * * * *